US011978737B2

United States Patent
Zhang et al.

(10) Patent No.: US 11,978,737 B2
(45) Date of Patent: May 7, 2024

(54) THREE-DIMENSIONAL MEMORY DEVICE AND FABRICATION METHOD THEREOF

(71) Applicant: Yangtze Memory Technologies Co., Ltd., Wuhan (CN)

(72) Inventors: Kun Zhang, Wuhan (CN); Wenxi Zhou, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

(21) Appl. No.: 16/984,772

(22) Filed: Aug. 4, 2020

(65) Prior Publication Data
US 2022/0005825 A1    Jan. 6, 2022

Related U.S. Application Data

(63) Continuation of application No. PCT/CN2020/100466, filed on Jul. 6, 2020.

(51) Int. Cl.
*H01L 27/11524*    (2017.01)
*H01L 21/768*    (2006.01)
(Continued)

(52) U.S. Cl.
CPC ......... *H10B 43/27* (2023.02); *H01L 23/5226* (2013.01); *H10B 43/10* (2023.02);
(Continued)

(58) Field of Classification Search
CPC ............. H01L 29/515; H01L 27/11575; H01L 27/11582; H01L 27/11565; H01L 27/1157;
(Continued)

(56) References Cited

U.S. PATENT DOCUMENTS 8,581,330 B2    11/2013    Kiyotoshi
9,524,981 B2    12/2016    Pachamuthu et al.
(Continued)

FOREIGN PATENT DOCUMENTS

| CN | 110062958 A | 7/2019 |
| CN | 110121778 A | 8/2019 |
| TW | 202021098 A | 6/2020 |

OTHER PUBLICATIONS

The World Intellectual Property Organization (WIPO) International Search Report for PCT/CN2020/100466 dated Apr. 7, 2021 4 pages.

*Primary Examiner* — Mary A Wilczewski
*Assistant Examiner* — Tsz K Chiu
(74) *Attorney, Agent, or Firm* — Anova Law Group, PLLC

(57) ABSTRACT

Three-dimensional (3D) NAND memory devices and methods are provided. In one aspect, a 3D NAND memory device includes a substrate, a layer stack, memory cells, a semiconductor layer, a contact structure, and gate line slit structures. The substrate includes a doped region. The layer stack is formed over the substrate. The memory cells are formed through the layer stack over the substrate. The semiconductor layer is formed on the doped region and a side portion of a channel layer that extends through the layer stack. The contact structure electrically contacts the doped region. A dielectric material is filled in the gate line slit structures. Air gaps are formed in the gate line slit structures by the dielectric material.

20 Claims, 27 Drawing Sheets

(51) Int. Cl.
*H01L 23/485* (2006.01)
*H01L 23/522* (2006.01)
*H01L 27/115* (2017.01)
*H10B 43/10* (2023.01)
*H10B 43/27* (2023.01)
*H10B 43/35* (2023.01)
*H10B 41/27* (2023.01)
*H10B 41/35* (2023.01)
*H10B 41/41* (2023.01)

(52) U.S. Cl.
CPC ........ *H10B 43/35* (2023.02); *H01L 21/76831* (2013.01); *H10B 41/27* (2023.02); *H10B 41/35* (2023.02); *H10B 41/41* (2023.02)

(58) Field of Classification Search
CPC ........... H01L 23/5226; H01L 27/11524; H01L 27/11529; H01L 27/11556; H01L 27/11573; H01L 23/5283; H01L 21/76816; H01L 21/76865; H01L 21/76877; H01L 21/76831; H10B 43/27; H10B 41/35; H10B 41/41; H10B 41/27; H10B 43/45
See application file for complete search history.

(56) References Cited

U.S. PATENT DOCUMENTS

| | | | |
|---|---|---|---|
| 9,530,790 B1* | 12/2016 | Lu | H01L 27/11575 |
| 9,875,929 B1 | 1/2018 | Shukla et al. | |
| 10,147,732 B1* | 12/2018 | Hu | H01L 27/11524 |
| 10,283,452 B2* | 5/2019 | Zhu | H10B 43/40 |
| 10,347,654 B1* | 7/2019 | Iwai | H01L 27/11582 |
| 10,510,738 B2 | 12/2019 | Kim et al. | |
| 10,790,300 B2* | 9/2020 | Rajashekhar | H01L 27/11573 |
| 2013/0228928 A1* | 9/2013 | Kuge | H10B 43/27 257/E21.294 |
| 2013/0264631 A1* | 10/2013 | Alsmeier | H01L 29/512 257/324 |
| 2016/0260733 A1 | 9/2016 | Lue | |
| 2016/0336340 A1* | 11/2016 | Song | H01L 23/485 |
| 2017/0025428 A1* | 1/2017 | Lai | H01L 27/11556 |
| 2017/0148811 A1* | 5/2017 | Zhang | H01L 28/00 |
| 2019/0157274 A1* | 5/2019 | Chang | H10B 12/34 |
| 2019/0280001 A1* | 9/2019 | Terasawa | H01L 23/5283 |
| 2019/0333931 A1* | 10/2019 | Jung | H01L 21/28525 |
| 2019/0355741 A1* | 11/2019 | Lee | H01L 21/76877 |
| 2019/0393238 A1 | 12/2019 | Lim et al. | |
| 2020/0343235 A1* | 10/2020 | Zhang | H01L 25/18 |
| 2020/0350330 A1* | 11/2020 | Ahn | H01L 27/11575 |

\* cited by examiner

THREE-DIMENSIONAL MEMORY DEVICE AND FABRICATION METHOD THEREOF

CROSS-REFERENCE TO RELATED APPLICATION

This application claims the priority to PCT Patent Application No. PCT/CN2020/100466 filed on Jul. 6, 2020, the entire content of which is incorporated herein by reference.

FIELD OF THE TECHNOLOGY

This application relates to the field of semiconductor technology and, specifically, to a three-dimensional (3D) memory device and fabrication method thereof.

BACKGROUND OF THE DISCLOSURE

An NAND memory is a non-volatile type of memory that does not require power to retain stored data. The growing demands of consumer electronics, cloud computing, and big data bring about a constant need of NAND memories of larger capacity and better performance. As conventional two-dimensional (2D) NAND memory approaches its physical limits, three-dimensional (3D) NAND memory is now playing an important role. 3D NAND memory uses multiple stack layers in a single chip to achieve higher density, higher capacity, faster performance, lower power consumption, and better cost efficiency.

A 3D NAND structure is built on a substrate, such as a silicon wafer. Many layers are formed on the substrate to form a layer stack in a fabrication process. When multiple layers, e.g., silicon oxide layers, silicon nitride layers, polycrystalline silicon (polysilicon) layers, and/or tetraethyl orthosilicate (TEOS) layers, are stacked on top of each other, stress can build up in the wafer and cause wafer bowing. Other fabrication processes, such as etching, filling, and thermal processes, may further exacerbate the stress and wafer bow problems. This may lead to poor alignment for underlying features. When wafer bow exceeds certain limit, operation difficulties and yield issues may occur.

The disclosed methods and systems are directed to solve one or more problems set forth above and other problems.

SUMMARY

In one aspect of the present disclosure, a 3D NAND memory device includes a substrate having a doped region, a layer stack, memory cells, a semiconductor layer, a contact structure, and gate line slit structures. The layer stack is formed over the substrate. The memory cells are formed through the layer stack over the substrate. The semiconductor layer is formed on the doped region and a side portion of a channel layer that extends through the layer stack. The contact structure electrically contacts the doped region. The gate line slit structures are formed through the layer stack to separate the memory cells into blocks. A dielectric material is filled in each of the gate line slit structures. One or more air gaps are formed in one or more of the gate line slits by the dielectric material.

In another aspect of the present disclosure, a fabrication method for a 3D NAND memory device includes forming a layer stack over a doped region of a substrate, forming memory cells through the layer stack over the doped region, forming a semiconductor layer on the doped region and a side portion of a channel layer that extends through the layer stack, forming a contact structure that electrically contacts the doped region, forming gate line slit structures through the layer stack to separate the memory cells into blocks, and filling each of the gate line slit structures by a dielectric material. One or more air gaps are formed in one or more of the gate line slit structures by the dielectric material.

In another aspect of the present disclosure, a fabrication method for a 3D NAND memory device includes forming a layer stack over a first substrate, trimming the layer stack to form a staircase structure, forming a channel layer, forming a gate line slit structure, and filling the gate line slit structure with a filling material to form an air gap. A maximum width of the air gap is equal to or greater than a value that is obtained using measurement results or estimate results. The layer stack includes first stack layers and second stack layers that are alternately stacked. The first stack layers include a first dielectric material and the second stack layers include a second dielectric material. The channel layer and the gate line slit structure extend through the layer stack along a direction approximately perpendicular to the first substrate.

Other aspects of the present disclosure can be understood by those skilled in the art in light of the description, the claims, and the drawings of the present disclosure.

DETAILED DESCRIPTION

The following describes the technical solutions in the embodiments of the present disclosure with reference to the accompanying drawings. Wherever possible, the same reference numbers will be used throughout the drawings to refer to the same or like parts. Apparently, the described embodiments are merely some but not all of the embodiments of the present disclosure. Features in various embodiments may be exchanged and/or combined. Other embodiments obtained by a person skilled in the art based on the embodiments of the present disclosure without creative efforts shall fall within the scope of the present disclosure.

Figure 1:
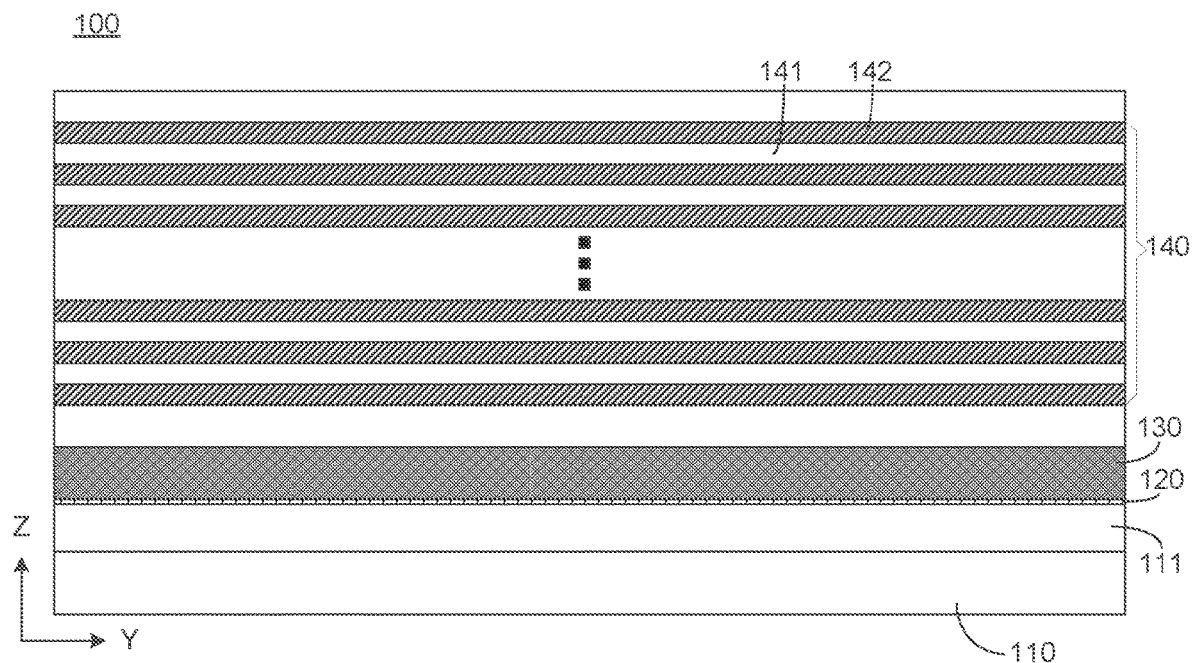
FIGS. 1 and 2 illustrate schematically cross-sectional views of a three-dimensional (3D) array device in an exemplary fabrication process according to embodiments of the present disclosure.

FIGS. 1-11 schematically show a fabrication process of an exemplary 3D array device 100 according to embodiments of the present disclosure. Among FIGS. 1-11, cross-sectional views are in a Y-Z plane and top views are in an X-Y plane. As shown in FIG. 1, the 3D array device 100 includes a substrate 110.

In some embodiments, the substrate 110 may include a single crystalline silicon layer. In some other embodiments, the substrate 110 may include a semiconductor material, such as germanium (Ge), silicon-germanium (SiGe), silicon carbide (SiC), silicon-on-insulator (SOI), germanium-on-insulator (GOI), polysilicon, a Group III-V compound such as gallium arsenide (GaAs) or indium phosphide (InP), etc. In some other embodiments, the substrate 110 may include an electrically non-conductive material such as glass, a plastic material, or a ceramic material. As an example, the substrate 110 includes an undoped or lightly doped single crystalline silicon layer. In some other embodiments, the substrate 110 may be doped differently with p-type or n-type dopants. When the substrate 110 includes glass, plastic, or ceramic material, the substrate 110 may further include a thin layer of polysilicon deposited on the glass, plastic, or ceramic material. In this case, the substrate 110 may be processed like a polysilicon substrate.

In some embodiments, a top portion of the substrate 110 may be doped by n-type dopants via ion implantation and/or diffusion to form a doped region 111. The dopants of the doped region 111 may include, for example, phosphorus (P), arsenic (As), and/or antimony (Sb). As shown in FIG. 1, a cover layer 120 may be deposited over the doped region 111. The cover layer 120 may be a sacrificial layer and may include a single layer, a multi-layer, or a suitable composite layer. For example, the cover layer 120 may include one or more of silicon oxide layer and silicon nitride layer. The cover layer 120 may be deposited by chemical vapor deposition (CVD), physical vapor deposition (PVD), atomic layer deposition (ALD), or a combination thereof. In some other embodiments, the cover layer 120 may include another material such as aluminum oxide.

Over the cover layer 120, a sacrificial layer 130 may be deposited. The sacrificial layer 130 may include a dielectric material, a semiconductor material, or a conductive material. For example, the sacrificial layer 130 may be single crystalline silicon or polysilicon, which may be deposited by a CVD and/or PVD process. An exemplary material for the sacrificial layer 130 is polysilicon.

After the polysilicon sacrificial layer 130 is formed, a layer stack 140 may be formed. The layer stack 140 includes multiple pairs of stack layers 141 and 142, e.g., the stack layers 141 and 142 are stacked alternately over each other. For example, the layer stack may include 64 pairs, 128 pairs, or more than 128 pairs of the stack layers 141 and 142.

In some embodiments, the stack layers 141 and 142 may include a first dielectric material and a second dielectric material that is different from the first dielectric material, respectively. The alternating stack layers 141 and 142 may be deposited via CVD, PVD, ALD, or a combination thereof. Exemplary materials for the stack layers 141 and 142 include silicon oxide and silicon nitride, respectively. The silicon oxide layer may be used as an isolation stack layer and the silicon nitride layer may be used as a sacrificial stack layer. The sacrificial stack layer may be subsequently etched out and replaced by a conductor layer that includes an electrically conductive material.

Figure 2:
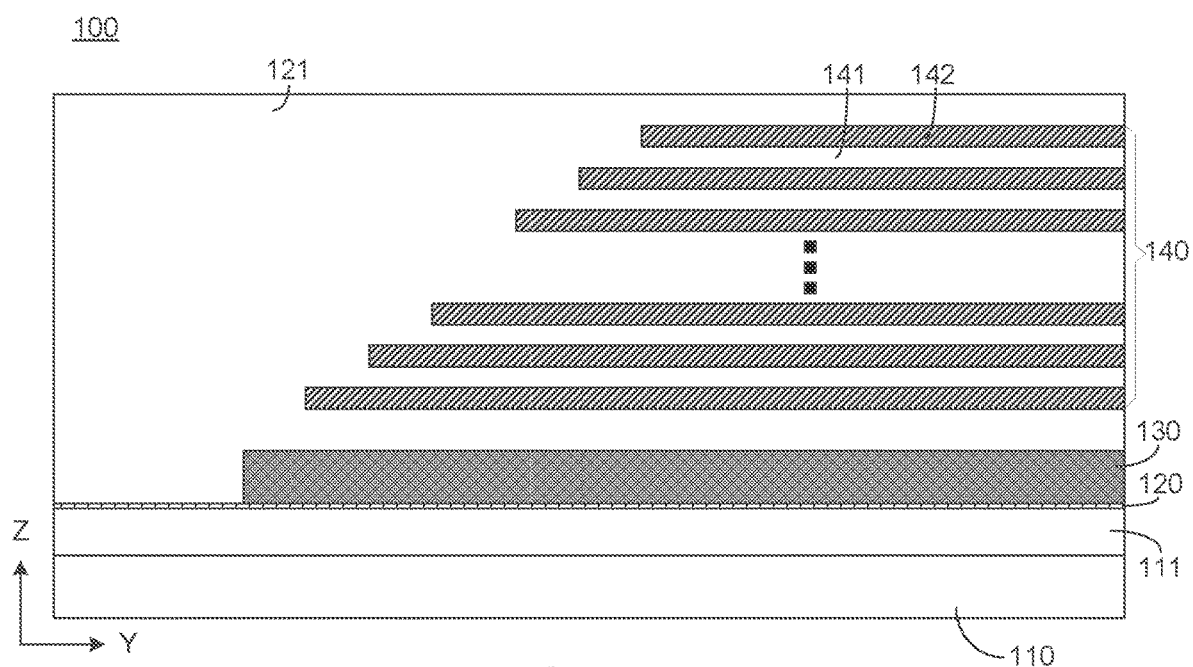

Referring to FIG. 2, a staircase structure may be formed based on the layer stack 140 by a staircase formation process. Any suitable etching process, including dry etch and/or wet etch processes, may be used in the staircase formation process. The layer stack 140 may be trimmed by the etching process to form the staircase structure. For example, the height of the staircase structure of the layer stack 140 may increase in a stepwise manner along the Y direction as shown in FIG. 2. A dielectric layer 121 is formed to cover the staircase structure.

Figure 3:
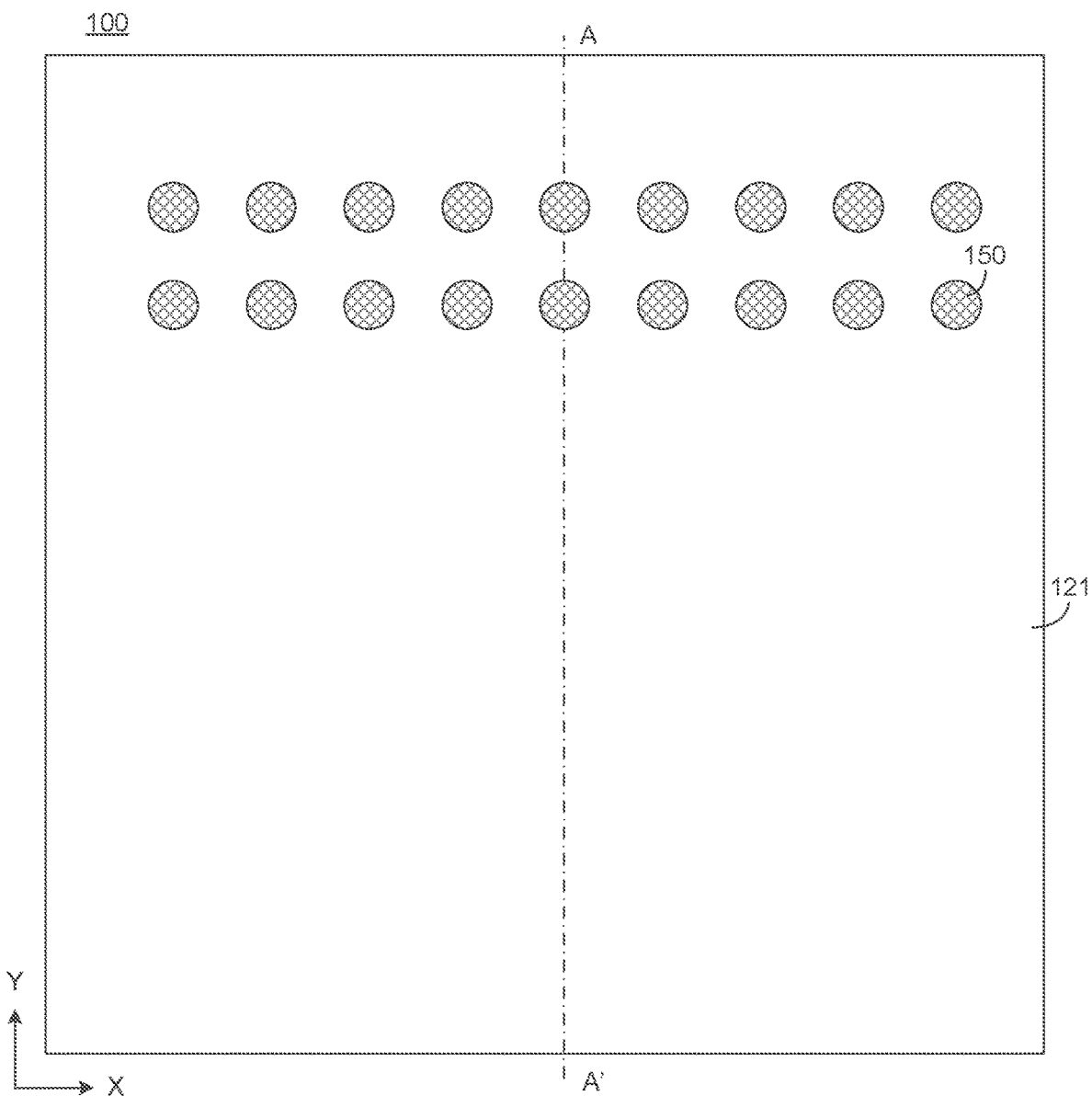
FIGS. 3 and 4 illustrate schematically a top view and a cross-sectional view of the 3D array device shown in FIG. 2 after channel holes are formed according to embodiments of the present disclosure.
Figure 4:
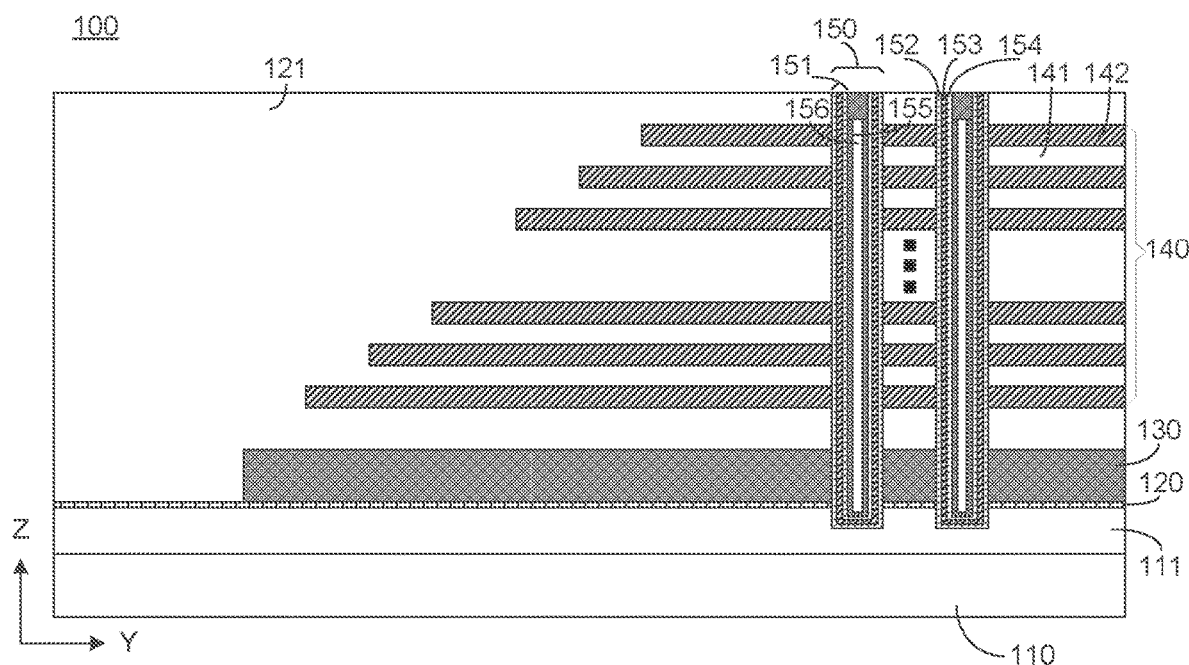

FIGS. 3 and 4 schematically show a top view and a cross-sectional view of the 3D array device 100 after channel holes 150 are formed and then filled with layer structures according to embodiments of the present disclosure. The quantity, dimension, and arrangement of the channel holes 150 shown in FIGS. 3 and 4 and in other figures in the present disclosure are only exemplary and for description purposes, although any suitable quantity, dimension, and arrangement may be used for the disclosed device 100 according to various embodiments of the present disclosure.

The channel holes 150 are configured to extend in the Z direction or in a direction approximately perpendicular to the substrate 110 and form an array of a predetermined pattern in the X-Y plane. The cross-sectional view shown in FIG. 4 is taken along a line AA' of FIG. 3. FIG. 4 only illustrates some of the channel holes 150 of FIG. 3 that are in the cross section in the Y-Z plane.

The channel holes 150 may be formed by, e.g., a dry etch process or a combination of dry and wet etch processes. Other fabrication processes may also be performed, such as a patterning process involving lithography, cleaning, and/or chemical mechanical polishing (CMP). The channel holes 150 may have a cylinder shape or pillar shape that extends through the layer stack 140, the sacrificial layer 130, the cover layer 120, and partially penetrates the doped region 111. After the channel holes 150 are formed, a functional layer 151 may be deposited on the sidewall and bottom of the channel hole. The functional layer 151 may include a blocking layer 152 on the sidewall and bottom of the channel hole to block an outflow of charges, a charge trap layer 153 on a surface of the blocking layer 152 to store charges during an operation of the 3D array device 100, and a tunnel insulation layer 154 on a surface of the charge trap layer 153. The blocking layer 152 may include one or more layers that may include one or more materials. The material for the blocking layer 152 may include silicon oxide, silicon nitride, silicon oxynitride, a high-k dielectric material such as aluminum oxide or hafnium oxide, another wide bandgap material, etc. The charge trap layer 153 may include one or more layers that may include one or more materials. The materials for the charge trap layer 153 may include polysilicon, silicon nitride, silicon oxynitride, nanocrystalline silicon, another wide bandgap material, etc. The tunnel insulation layer 154 may include one or more layers that may include one or more materials. The material for the tunnel insulation layer 154 may include silicon oxide, silicon nitride, silicon oxynitride, a high-k dielectric material such as aluminum oxide or hafnium oxide, another wide bandgap material, etc.

In some embodiments, the functional layer 151 may include an oxide-nitride-oxide (ONO) structure. In some other embodiments, however, the functional layer 151 may have a structure different from the ONO configuration. For example, the functional layer 151 may include a silicon oxide layer, a silicon nitride layer, and another silicon oxide layer.

As shown in FIG. 4, the blocking layer 152 may be, e.g., a silicon oxide layer deposited on the sidewall of the channel hole 150. The charge trap layer 153 may be, e.g., a silicon nitride layer deposited on the blocking layer 152. The tunnel insulation layer 154 may be, e.g., another silicon oxide layer deposited on the charge trap layer 153. A channel layer 155, also referred to as a "semiconductor channel", may be, e.g., a polysilicon layer deposited on the tunnel insulation layer 154. In some other embodiments, the channel layer 155 may include amorphous silicon. Like the channel holes, the channel layers 155 also extend through the layer stack 140 and into the doped region 111. As shown in FIG. 4, a portion of each functional layer 151 is configured between a portion of one of the stack layers 141 and 142 and a portion of one of the channel layers 155. The blocking layer 152, the charge trap layer 153, the tunnel insulation layer 154, and the channel layer 155 may be deposited by, e.g., CVD, PVD, ALD, or a combination of two or more of these processes.

The channel holes 150 may be filled by an oxide material 156 after the channel layers 155 are formed.

In the process described above, the channel holes 150 are etched after the staircase structure is formed. In some other embodiments, the channel holes 150 may be formed before the staircase formation process. For example, after the layer structure 140 is fabricated as shown in FIG. 1, channel holes 150 may be formed and then the functional layer 151 and the channel layer 155 may be deposited. After the channel holes 150 are filled with the oxide material 156, the staircase formation process may be performed to form the staircase structure as shown in FIG. 4.

In some other embodiments, the layer stack 140 may be referred to as the first layer stack. After the layer stack 140 (i.e., the first layer stack) in the staircase form is made and the channel holes 150 with the functional layers 151 and the channel layers 155 are fabricated, a second layer stack (not shown) in the staircase form may be made over the layer stack 140. Channel holes that are aligned with the channel holes 150 may be formed, and the functional layers and channel layers may be deposited in the second layer stack. Each channel layer of the second layer stack may be aligned with and electrically connected to a corresponding channel layer 155. In a similar manner, a third or more layer stacks may be formed over the second layer stack. As such, multiple layer stacks may be formed and integrated over the substrate 110 and the memory capacity of the 3D array device 100 may be multiplied. In the description below, the layer stack 140 is used to illustrate structures and fabrication method of the device 100.

Figure 5:
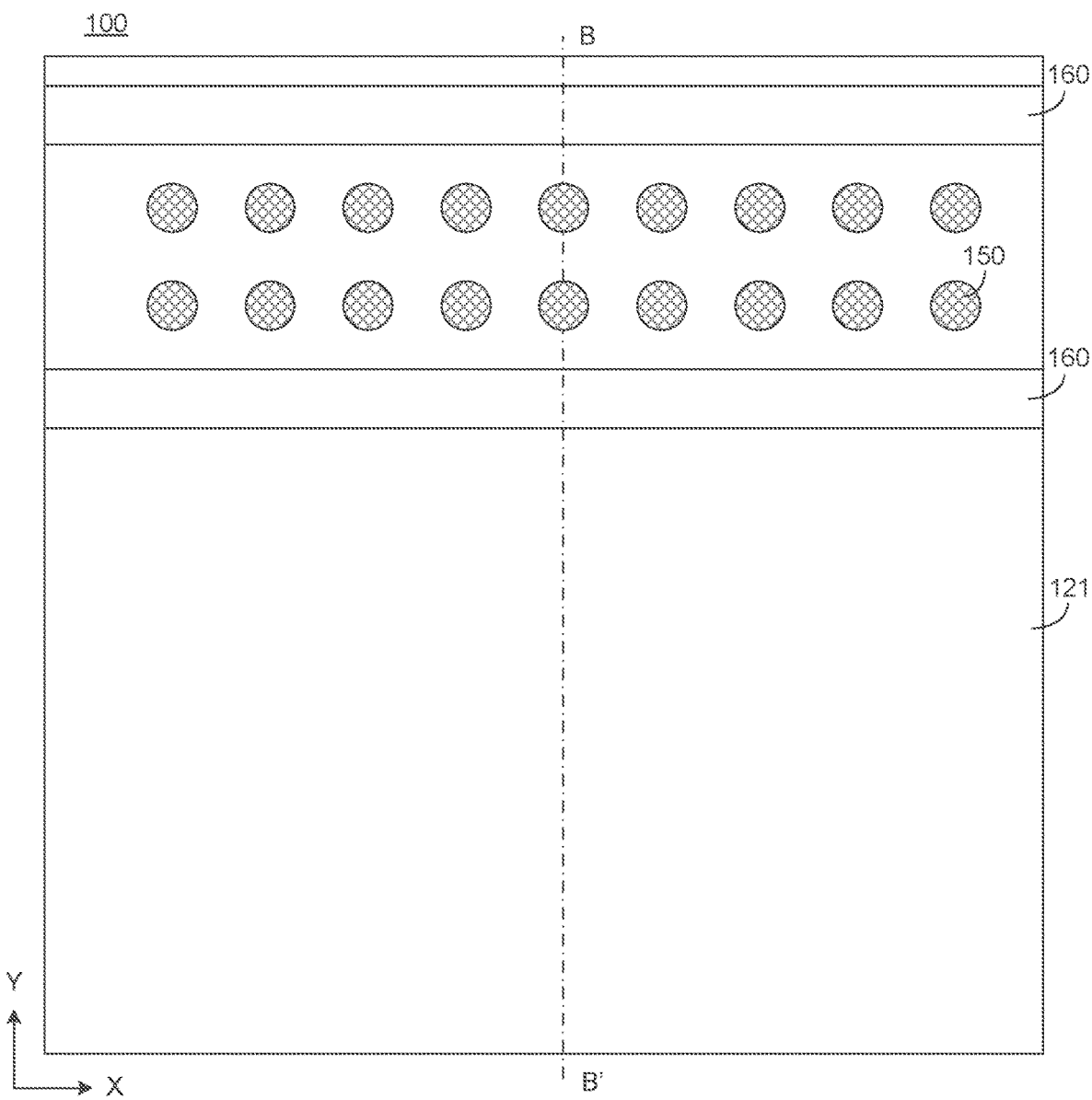
FIGS. 5 and 6 illustrate schematically a top view and a cross-sectional view of the 3D array device shown in FIGS. 3 and 4 after gate line slits are formed according to embodiments of the present disclosure.
Figure 6:
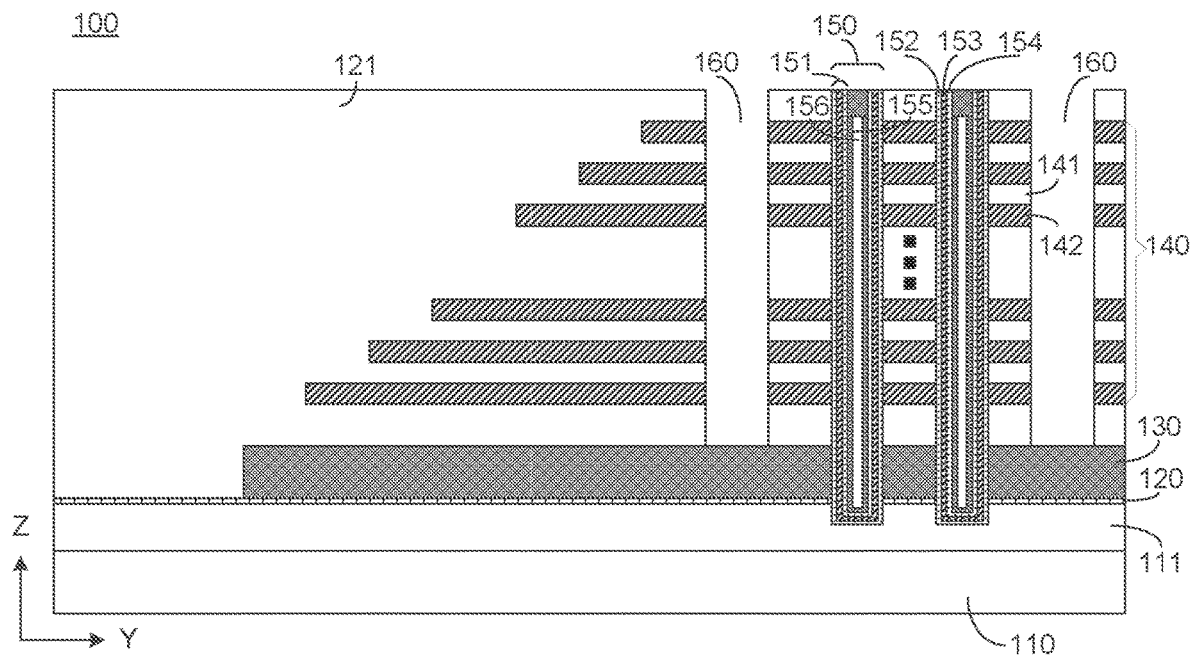

FIGS. 5 and 6 schematically show a top view and a cross-sectional view of the 3D array device 100 after gate line slits 160 are formed according to embodiments of the present disclosure. The cross-sectional view shown in FIG. 6 is taken along a line BB' of FIG. 5. The 3D array device 100 may have a great number of NAND memory cells configured in the layer stack 140 or residing in the layer stack 140. The layer stack 140 may be divided into multiple memory blocks. In some embodiments, NAND memory cells belonging to a memory block may be reset together in a block erase operation. The channel holes shown in FIG. 5 may form an exemplary memory block that is separated from other memory block regions (not shown) by the gate line slits 160 which may also be referred to as gate line slit structures 160. For example, a pair of the gate line slits 160 shown in FIGS. 5 and 6 defines a block there-between. In some other embodiments, one or more additional gate line slits may be formed between a pair of the gate line slits 160.

As the layer stack 140 is formed with multiple stack layers 141 and 142 deposited one over another, stress is introduced, which causes wafer bowing. The staircase formation process plus the filling process of the channel holes can make the wafer bow further. As a bowed wafer causes alignment problems and even yield issues, reduction of film stress and wafer bow is highly desired.

During the fabrication of the 3D array device 100, wafer bow may be measured, especially after the staircase structure is made and the channel holes 150 are formed. Wafer bowing can be detected directly using an optical method. In some embodiments, the lowest point and the highest point of the 3D array device 100 may be detected optically and the wafer bowing can be calculated using the measurement results. In some embodiments, after the wafer bowing is quantified, the position, dimension, profile in the Y-Z plane, and filling of the gate line slits 160 may be determined to reduce wafer bow.

In some other embodiments, wafer bow is not directly measured during a fabrication process. Instead, wafer bow may be determined using other data and previous records. The other data may include materials used, processes performed, and measurement data other than that of wafer bow detection. The previous records may include measurement results and bow reduction solutions obtained previously.

In some embodiments, the dimensions and shapes of the gate line slits 160 may be the same or similar. In some other embodiments, the dimensions and shapes of the gate line slits 160 may be arranged differently for reducing wafer bow. For example, the maximum slit width of one slit may be different than that of another slit along the Y direction.

The gate line slits 160 may be formed by, e.g., a dry etch process or a combination of dry and wet etch processes. As shown in FIG. 6, the gate line slits 160 may extend through the layer stack 140 and reach or partially penetrate the sacrificial layer 130 in the Z direction or in a direction approximately perpendicular to the substrate 110. As such, at the bottom of the gate line slit 160, the sacrificial layer 130 is exposed. Then, spacer layers (not shown) may be deposited on the sidewall and bottom of the gate line slits 160 by CVD, PVD, ALD, or a combination of two or more of these processes. The spacer layers are configured to protect the stack layers 141 and 142 and may include, for example, silicon oxide and silicon nitride.

After the spacer layers are deposited, selective etching may be performed such that parts of the spacer layers at the bottom of the slits are removed by dry etch or a combination of dry etch and wet etch. As such, the sacrificial layer 130 is exposed again. Then a selective etch process, e.g., a selective wet etch process, may be performed to remove the sacrificial layer 130. Removal of the sacrificial layer 130 creates a cavity and exposes the cover layer 120 and bottom portions of the blocking layers 152 formed in the channel holes 150. Next, multiple selective etch processes, e.g., multiple selective wet etch processes, may be performed to remove the exposed portions of the blocking layer 152, the charge trap layer 153, and the tunnel insulation layer 154 consecutively, which exposes bottom side portions of the channel layer 155.

In some embodiments, the cover layer 120 may be silicon oxide. Then, the cover layer 120 may be removed when the bottom portions of the functional layer 151 are etched away. In some other embodiments, the cover layer 120 may include a material other than silicon oxide or silicon nitride. Then, the cover layer 120 may be removed by one or more additional selective etch processes. Removal of the cover layer 120 exposes the top surface of the doped region 111.

Thus, after the etch processes described above, the doped region 111 and side portions of the channel layers 155 close to the bottom of the channel hole 150 are exposed in the cavity left by etching away the sacrificial layer 130 and the cover layer 120. The cavity may be filled by a semiconductor material, e.g., polysilicon, to form a semiconductor layer 131, e.g., by a CVD and/or PVD deposition process. The semiconductor layer 131 may be n-doped. The semiconductor layer 131 may be formed on the exposed surface of the doped region 111 and on sidewalls or side portions of the channel layers 155, and may be electrically connected to the doped region 111 and the channel layers 155.

In some other embodiments, a selective epitaxial growth may be performed such that a layer of single crystalline silicon is grown on the exposed surface of the doped region 111 and a polysilicon layer is grown on the exposed surface of the channel layer 155. As such, the semiconductor layer 131 may include adjoined layers of single crystalline silicon and polysilicon.

Figure 7:
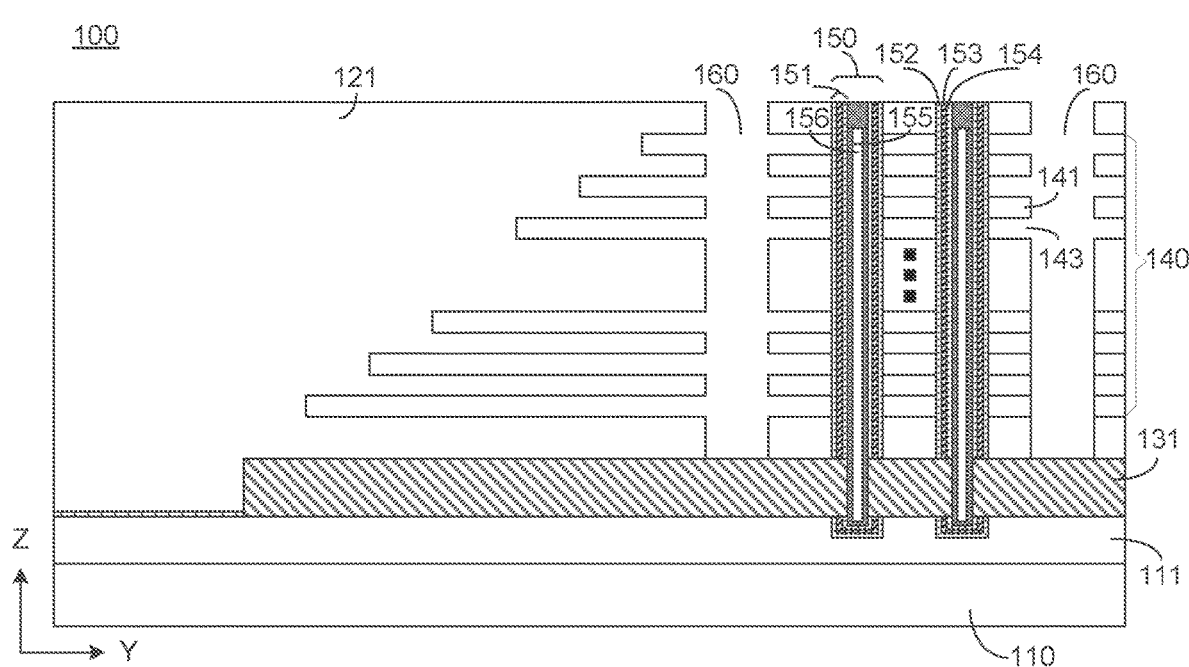
FIGS. 7 and 8 illustrate schematically cross-sectional views of the 3D array device shown in FIGS. 5 and 6 after certain fabrication steps according to embodiments of the present disclosure.

When the bottom parts of the functional layer 151 and the cover layer 120 are etched, some spacer layers may be etched away and the rest spacer layers may remain on the sidewall of gate line slits 160 to protect the stack layers 141 and 142. After the semiconductor layer 131 is formed, the remaining spacer layers may be removed in a selective etch process, e.g., a selective wet etch process. In some embodiments, the innermost spacer layer, which is in contact with the sidewall, is silicon nitride. Because the stack layer 142 is also silicon nitride layers, the innermost spacer layer and the silicon nitride layers 142 may be removed together during the etch process, leaving cavities 143 between the stack layers 141, as shown in FIG. 7.

Figure 8:
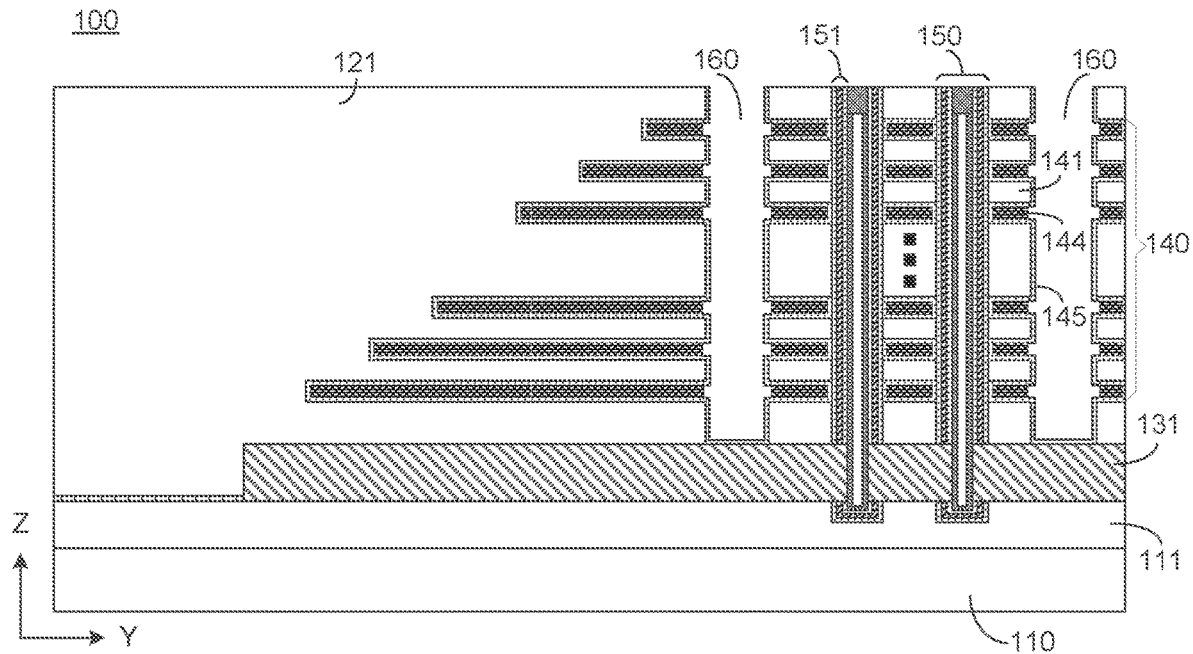

Thereafter, an electrically conductive material such as tungsten (W) may be grown to fill the cavities 143 left by the removal of the stack layers 142, forming conductor layers 144 between the stack layers 141. That is, the conductor layers 144 replace the stack layers 142 and the layer stack 140 now includes alternating dielectric stack layers 141 and conductor layers 144, as shown in FIG. 8. In some embodiments, before metal W is deposited in the cavities 143, a dielectric layer 145 of a high-k dielectric material such as aluminum oxide may be deposited, followed by deposition of a layer of an electrically conductive material such as titanium nitride (not shown). Then metal W may be deposited to form the conductor layers 144. CVD, PVD, ALD, or a combination of two or more of these processes may be used in the deposition processes. In some other embodiments, another conductive material, such as cobalt (Co), copper (Cu), aluminum (Al), doped silicon, or any combination thereof, may be used to form the conductor layers 144.

A portion of each functional layer 151 in a channel hole 150 is between a portion of one of the conductor layers 144 and a portion of the channel layer 155 in the channel hole 150. Each conductor layer 144 is configured to electrically connect one or more rows of NAND memory cells along the Y direction or in the X-Y plane and is configured as a word line for the 3D array device 100. The channel layer 155 formed in the channel hole 150 is configured to electrically connect a column or a string of NAND memory cells along the Z direction and configured as a bit line for the 3D array device 100. As such, a portion of the functional layer 151 in the channel hole 150 in the X-Y plane, as a part of a NAND memory cell, is arranged between a conductor layer 144 and a channel layer 155, i.e., between a word line and a bit line. A portion of the conductor layer 144 that is around a portion of the channel hole 150 functions as a control gate or gate electrode for a NAND memory cell. The 3D array device 100 depicted in FIG. 8 can be considered as including a 2D array of strings of NAND cells (such a string is also referred to as a "NAND string"). Each NAND string contains multiple NAND memory cells and extends vertically toward the substrate 110. The NAND strings form a 3D array of the NAND memory cells.

In some embodiments, after the conductor layers 144 are formed, wafer bow of the 3D array device 100 may be measured and filling of the gate line slits 160 may be used to decrease wafer bow. In some other embodiments, wafer bow may be estimated using data available and previous records without direct measurement on wafer bow. The data that may be used for bow estimate may include materials used, processes performed, and measurement data other than that of wafer bow detection. The previous records may include measurement data and bow reduction solutions obtained in the past.

Figure 9A:
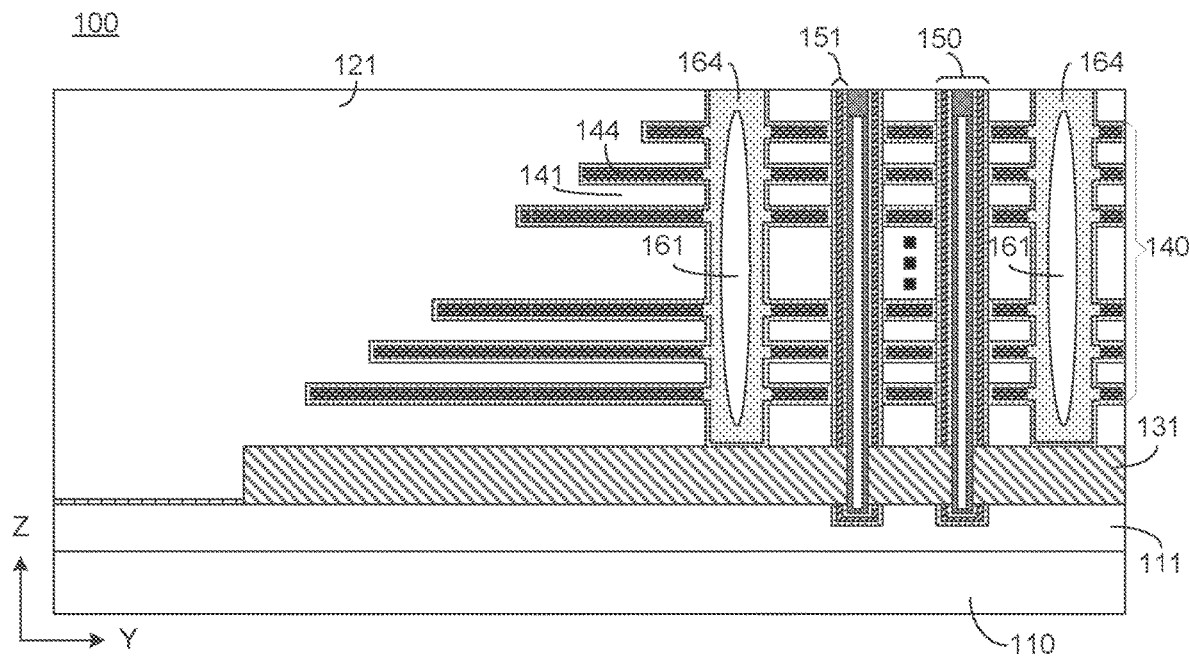
FIGS. 9A, 9B, and 9C illustrate schematically cross-sectional views of the 3D array device shown in FIG. 8 after air gaps are formed according to embodiments of the present disclosure.
Figure 9B:
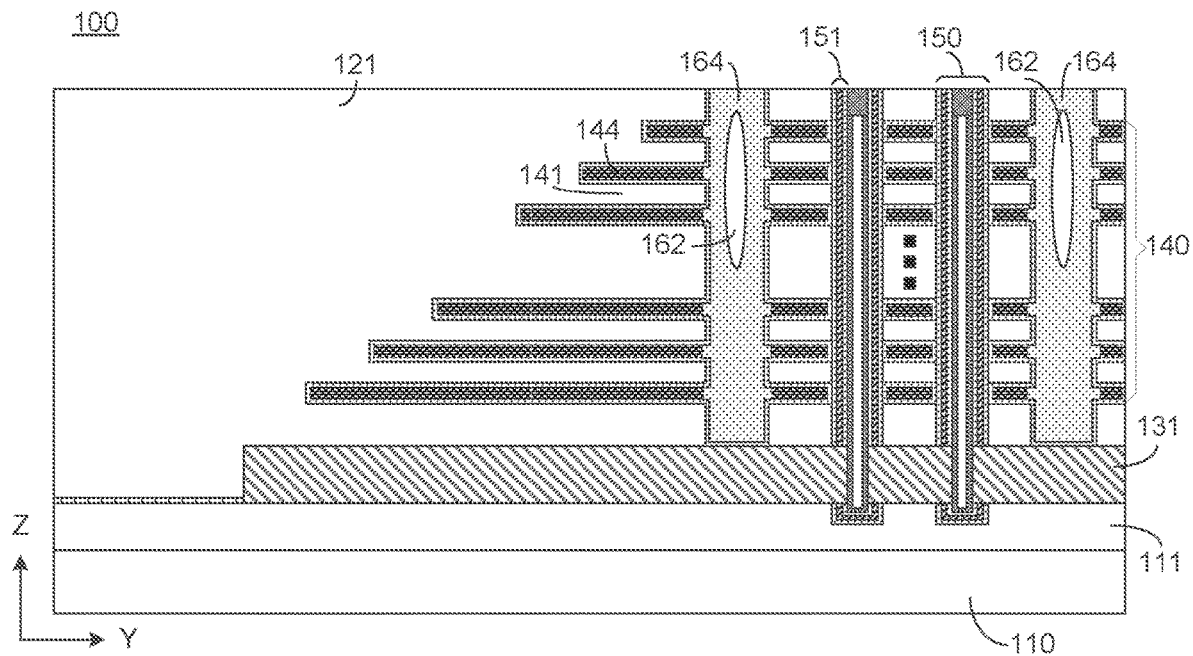
Figure 9C:
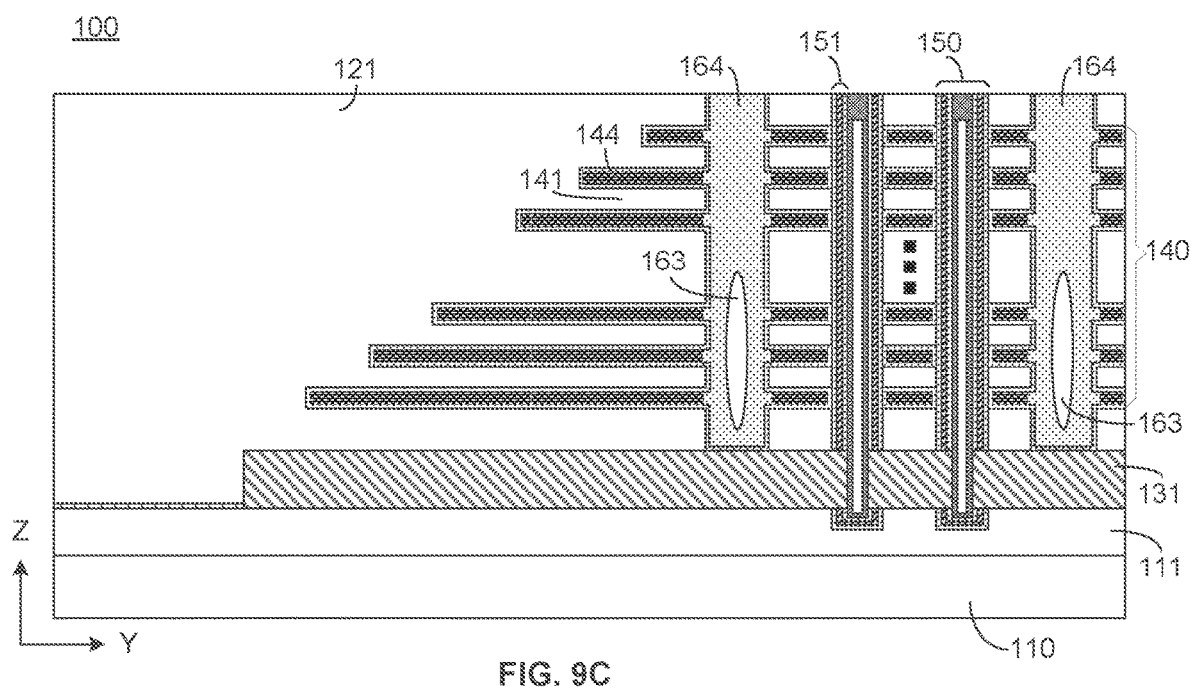

Gate line slits 160 may be filled with a dielectric material 164, including for example silicon oxide, silicon nitride, another dielectric material, or a combination of two or more of these materials. During the filling process, air gaps may be formed in the dielectric material 164, as shown in FIGS. 9A-9C. In various embodiments, the air gap may be enclosed by the dielectric material filled within a corresponding gate line slit or enclosed by the dielectric material together with one or more sidewalls of the corresponding gate line slit.

The position, dimension, quantity, and shape of the air gaps may be designed and configured to reduce wafer bow, based on the measurement results or estimate results on wafer bow. In some embodiments, the status of wafer bow may be calculated using the measurement results or estimate results. Then, a width value may be calculated or obtained based on the wafer bow status. The maximum width of the air gap in the Y direction may be configured equal to or greater than the width value to reduce wafer bow. For example, the maximum width of the air gap may be equal to or larger than half of the gate line slit width in the Y direction.

In various embodiments, the extension range of the air gap in the Z direction may be adjusted to reduce wafer bow. For example, as shown in FIG. 9A, air gaps 161 may extend in a direction approximately perpendicular to the substrate 110, with the bottom of the air gap 161 close to the bottom of the gate line slit 160 and the top of the air gap 161 close to the top of the gate line slit 160.

In another example, as shown in FIG. 9B, air gaps 162 may be formed and located in an upper portion of the gate line slits 160, and extended in a direction approximately perpendicular to the substrate 110.

In still another example, as shown in FIG. 9C, air gaps 163 may be formed and located in a lower portion of the gate line slits 160, and extended in a direction approximately perpendicular to the substrate 110.

In still another example, multiple air gaps (not shown) may be formed in a gate line slit 160. For example, two air gaps (not shown) may be formed in an upper portion and a lower portion of the gate line slit 160 respectively, and extend in a direction approximately perpendicular to the substrate 110.

Hence, the air gaps may be formed at positions around the middle, upper (top), and/or lower (bottom) portions of a same gate line slit or different gate line slits, and formed with same or different shapes and/or dimensions within same or different gate line slits for wafer bow reduction.

In some embodiments, when the gate line slits 160 are filled with the dielectric material 164, the air gaps, e.g., air gaps 161, 162, or 163, may be formed in a same or similar manner with the same or similar positions, shapes, and dimensions. In some embodiments, when the gate line slits 160 are filled with the dielectric material 164, the air gaps may be formed in different manners with different positions, shapes, and/or dimensions.

For example, the 3D array device 100 may have some air gaps that resemble the air gap 161 of FIG. 9A and some air gaps that resemble the air gap 162 of FIG. 9B or the air gap 163 of FIG. 9C. In some embodiments, after the gate line slits 160 are filled with the dielectric material 164, some gate line slits may have an air gap (e.g., the air gap 161, 162, and/or 163), while some gate line slits may have no air gap or an air gap that is much smaller or otherwise different than the air gaps 161-163. For example, in some embodiments, one gate line slit 160 may have an air gap 161 and the other gate line slit 160 may have no air gap or only have a tiny air gap, e.g., an air gap whose width is smaller than one tenth of the width of the air gap 161 in the Y direction.

The air gaps may be formed by controlling the deposition process when the gate line slits 160 are filed with the dielectric material 164, such as silicon oxide or silicon nitride. An exemplary method to form the air gaps is the pinch off deposition. CVD, PVD, ALD, or a combination of two or more of these processes may be used in the filling process. For example, the oxide material may be grown on the sidewall and bottom of gate line slit 160 at a relative slow deposition rate. After the thickness of the oxide material at the bottom of the gate line slit 160 reaches a certain value, the deposition rate may be increased. As the deposition rate may be larger at a sidewall region close to the slit opening than a sidewall region away from the slit opening, the gate line slit 160 may be "closed" or fully filled with the dielectric material at the slit opening, before a large slit portion inside the gate line slit is filled. As such, an air gap similar to the air gap 161 may be formed.

To form an air gap similar to the air gap 162 in the upper portion of the gate line slit, the oxide material may be grown on the sidewall and bottom of gate line slit 160 at a relative slow deposition rate. During the deposition, if an air gap is formed in the lower portion, a dry etch process may be performed to remove some oxide material to allow continuous deposition of the oxide material until the lower portion of the gate line slit 160 is filled with the oxide material. Thereafter, the deposition rate may be increased to seal the slit and form an air gap similar to the air gap 162.

To form an air gap similar to the air gap 163 in the lower portion of the gate line slit, the deposition rate may be relative slow at first. After the thickness of the oxide material at the bottom of the gate line slit 160 reaches a certain value, the deposition rate may be increased. If the top of the air gap is too high after the air gap is formed, a dry etch process may be performed to remove some oxide material deposited above the air gap. Then the deposition process may continue at a relatively high rate until the air gap is formed again. If the top of the air gap is still too high in the Z direction, the etch-deposition process may repeat until an air gap similar to the air gap 163 forms. In the description below, the air gap 161 will be used as an example for the fabrication process of the 3D array device 100.

After the gate line slits 160 are filled, openings for peripheral contacts 171 and word line contacts 172 may be formed by, e.g., a dry etch process or a combination of dry and wet etch processes. The openings for peripheral contacts 171 and word line contacts 172 are then filled with a conductive material by CVD, PVD, ALD, electroplating, electroless plating, or any combination thereof. The conductive material that forms peripheral contacts 171 and word line contacts 172 may include W, Co, Cu, Al, or a combination of two or more of these materials. In some embodiments, a layer of a conductive material (e.g., titanium nitride) may be deposited as a contact layer before another conductive material is deposited when the peripheral contacts 171 and word line contacts 172 are fabricated.

Next, a CVD or PVD process may be performed to deposit a dielectric material (e.g., silicon oxide or silicon nitride) on the 3D array device 100. The dielectric layer 121 becomes thicker. Then openings for vias may be formed by a dry etch process or a combination of dry and wet etch processes. Some vias are configured for the peripheral contacts 171 and word line contacts 172. Some other vias are configured for each bit line contact that electrically contacts the upper end of a corresponding NAND string and individually addresses the corresponding NAND string. The openings are subsequently filled with a conductive material such as W, Co, Cu, Al, or a combination of two or more of these materials to form vias 173, 174, and 175. CVD, PVD, ALD, electroplating, electroless plating, or a combination thereof may be performed. Vias 173, 174, and 175 are electrically connected to the peripheral contacts 171, the word line contacts 172, and the bit line contacts, respectively. In some embodiments, a layer of a conductive material (e.g., titanium nitride) may be deposited first before filling the openings to form the vias 173-175.

Figure 10:
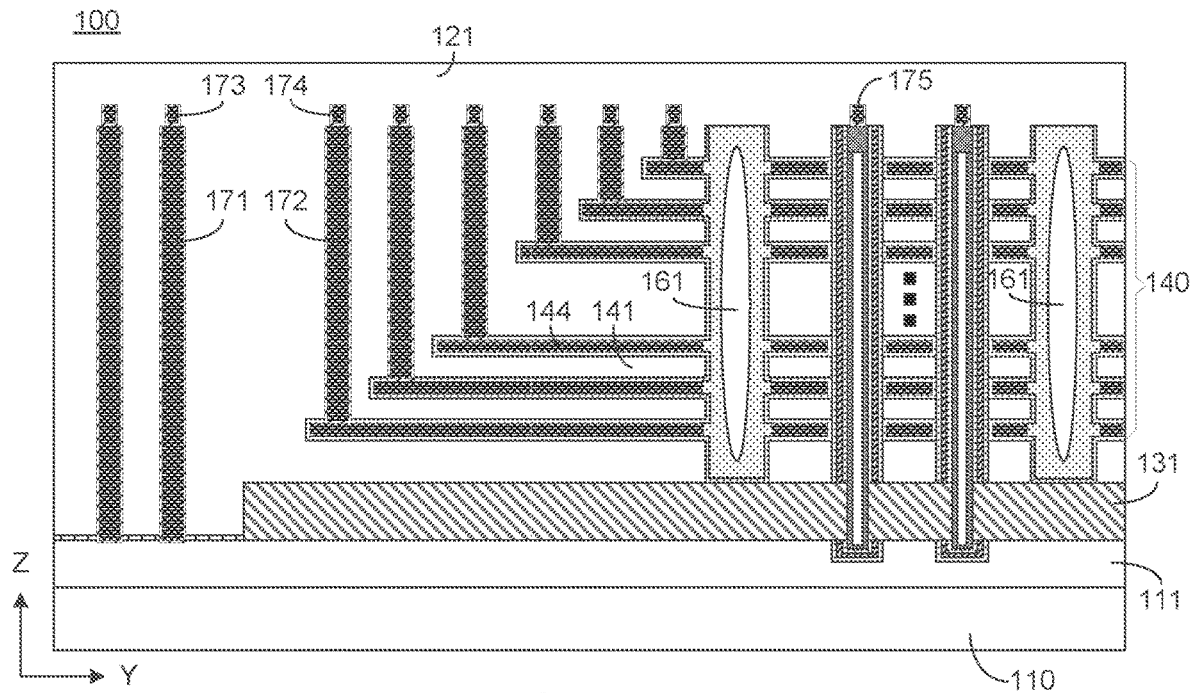
FIGS. 10 and 11 illustrate schematically cross-sectional views of the 3D array device shown in FIG. 9A after certain contacts are formed according to embodiments of the present disclosure.
Figure 11:
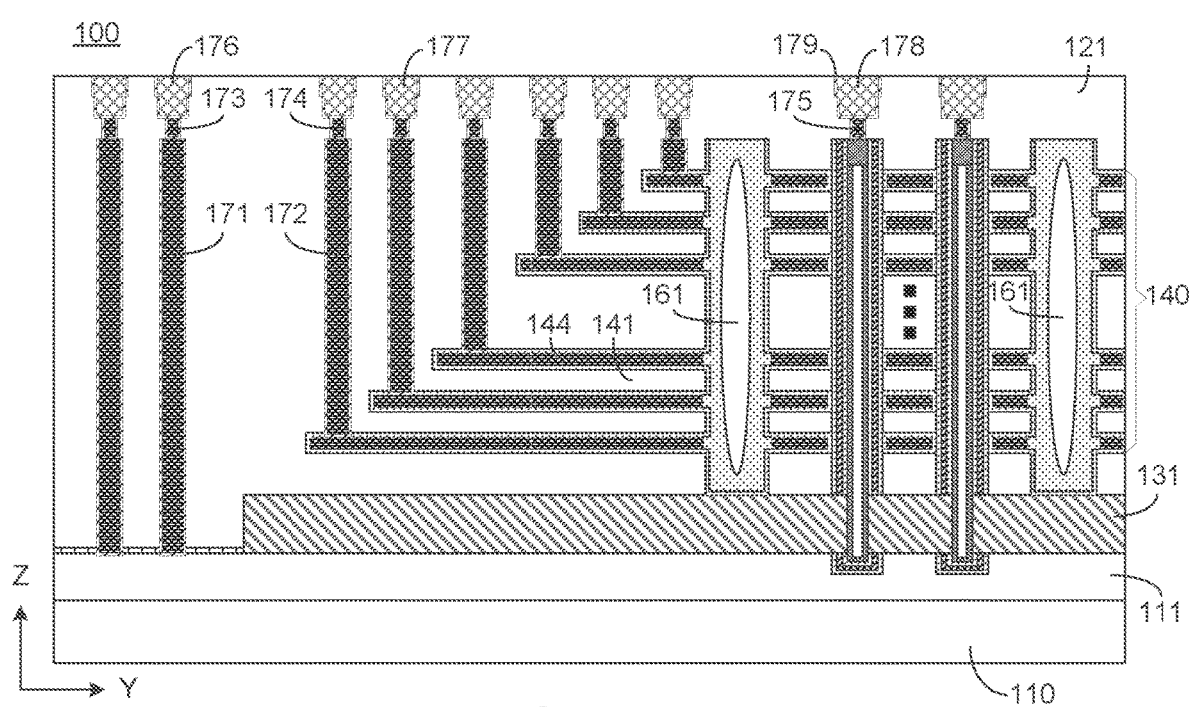

Then a dielectric material (e.g., silicon oxide or silicon nitride) may be deposited to bury the vias 173-175 and further makes the dielectric layer 121 thicker, as shown in FIG. 10. Similar to the formation of vias 173-175, openings are made and then filled to form contacts 176, 177, and 178 that serve as interconnects with a peripheral device. As shown in FIG. 11, the contacts 176-178 are electrically connected to vias 173-175, respectively. The contacts 176-178 may include W, Co, Cu, Al, or a combination of two or more of these materials. In some embodiments, a contact layer 179 of a conductive material (e.g., titanium nitride) may be deposited first before filling the openings to form the contacts 176-178.

FIGS. 12-17 schematically show a fabrication process of an exemplary 3D memory device 190 in cross-sectional views according to embodiments of the present disclosure. The 3D memory device 190 may include the 3D array device 100 shown in FIG. 11 and a peripheral device 180 that is configured to control the array device 100. The peripheral device 180 may include a substrate 181 that may include single crystalline silicon, Ge, SiGe, SiC, SOI, GOI, polysilicon, or a Group III-V compound such as GaAs or InP. Peripheral circuits (e.g., control circuits) (not shown) may be fabricated on the substrate 181 and used for facilitating the operation of the 3D memory device 190. For example, the peripheral circuits may include metal-oxide-semiconductor field-effect transistors (MOSFETs) and provide functional devices such as page buffers, sense amplifiers, column decoders, and row decoders. A dielectric layer 182, contacts 183 and 184, and vias may be formed over the substrate 181. The dielectric layer 182 may include one or more dielectric materials such as silicon oxide and silicon nitride. The contracts 183 and 184 are configured as interconnects with the 3D array device 100 and may include an electrically conductive material such as W, Co, Cu, Al, or a combination thereof.

Figure 12:
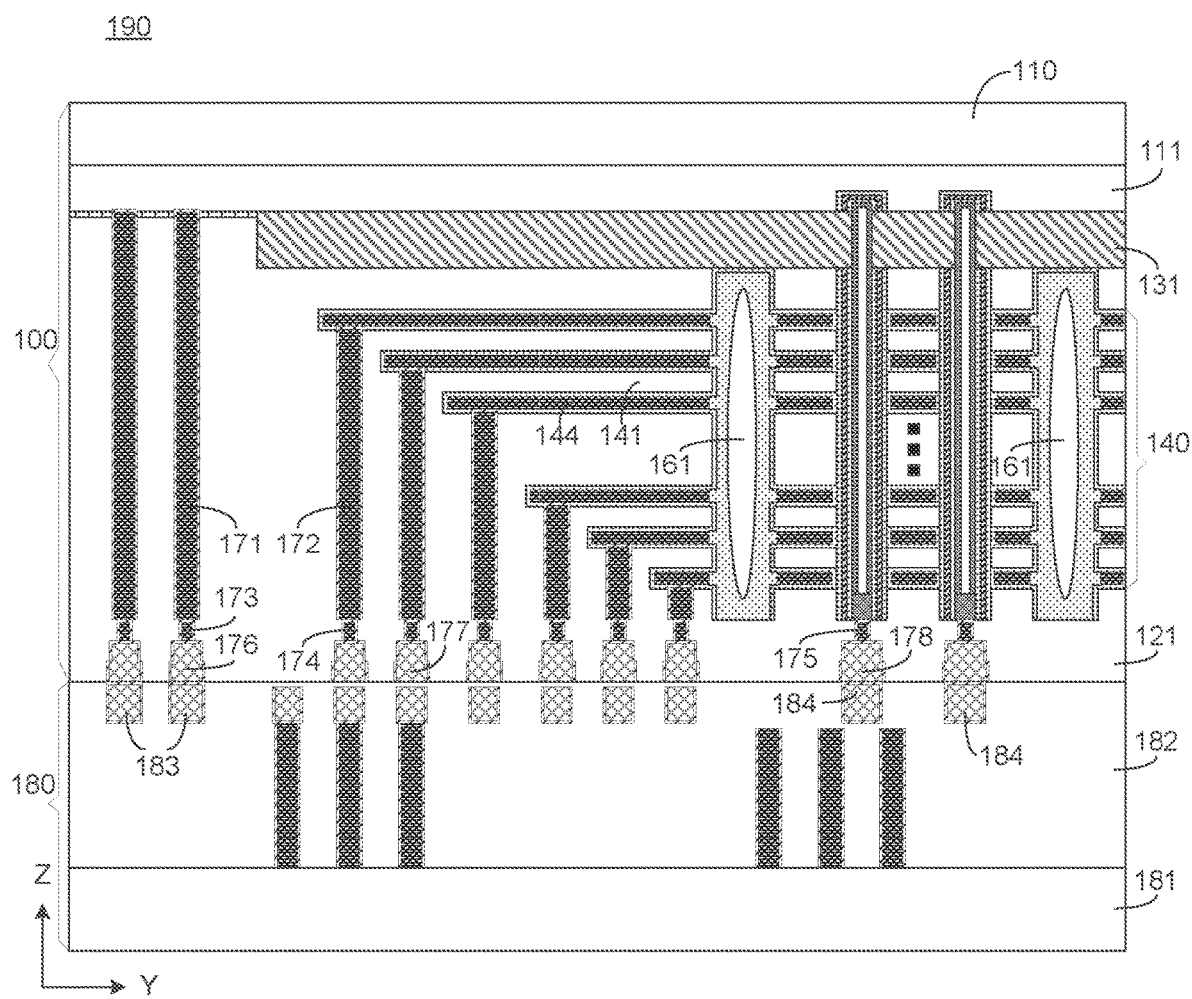
FIGS. 12-17 illustrate schematically cross-sectional views of a 3D memory device after the 3D array device shown in FIG. 11 is bonded with a peripheral device according to embodiments of the present disclosure.

The 3D array device 100 and peripheral device 180 may be bonded by the flip-chip bonding method. In some embodiments, the 3D array device 100 may be flipped and become upside down with the top surfaces of the contacts 176-178 facing downward in the Z direction. Then the peripheral device 180 may be placed below the 3D array device 100. After an alignment step is made, e.g., the contacts 176 and 178 may be aligned with the contacts 183 and 184, respectively, the 3D array device 100 and peripheral device 180 may be joined and bonded together, as shown in FIG. 12. Then, the layer stack 140 and the peripheral circuits (or the MOSFETs) become sandwiched between the substrates 110 and 181. In some embodiments, a solder or an electrically conductive adhesive may be used to bond the contacts 176 with the contacts 183 and bond the contacts 178 with the contacts 184. As such, the contacts 176 are electrically connected to the contacts 183, respectively, and the contacts 178 are electrically connected to the contacts 184, respectively. The 3D array device 100 and peripheral device 180 are in electrical communication after the flip-chip bonding process is completed.

Figure 13:
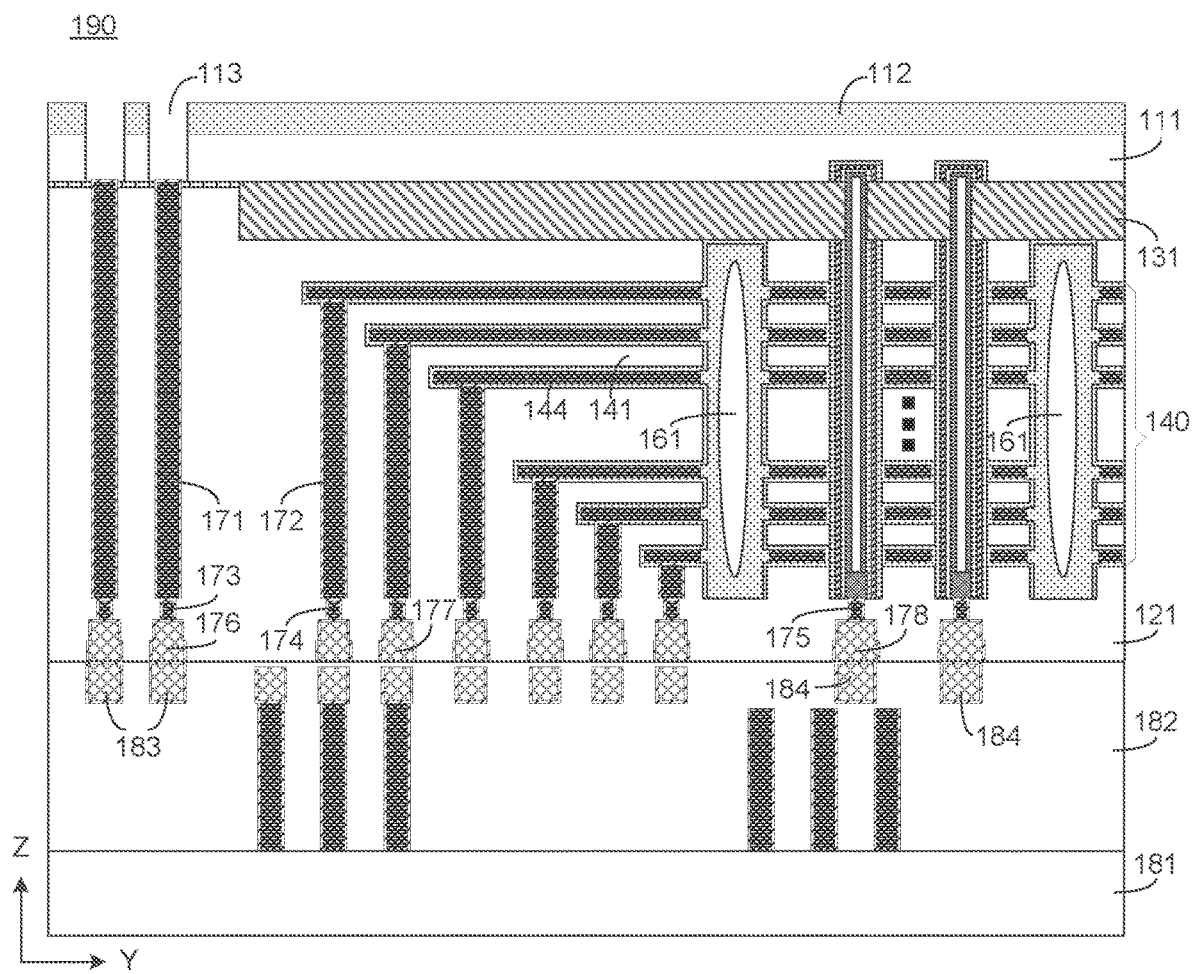
Figure 14:
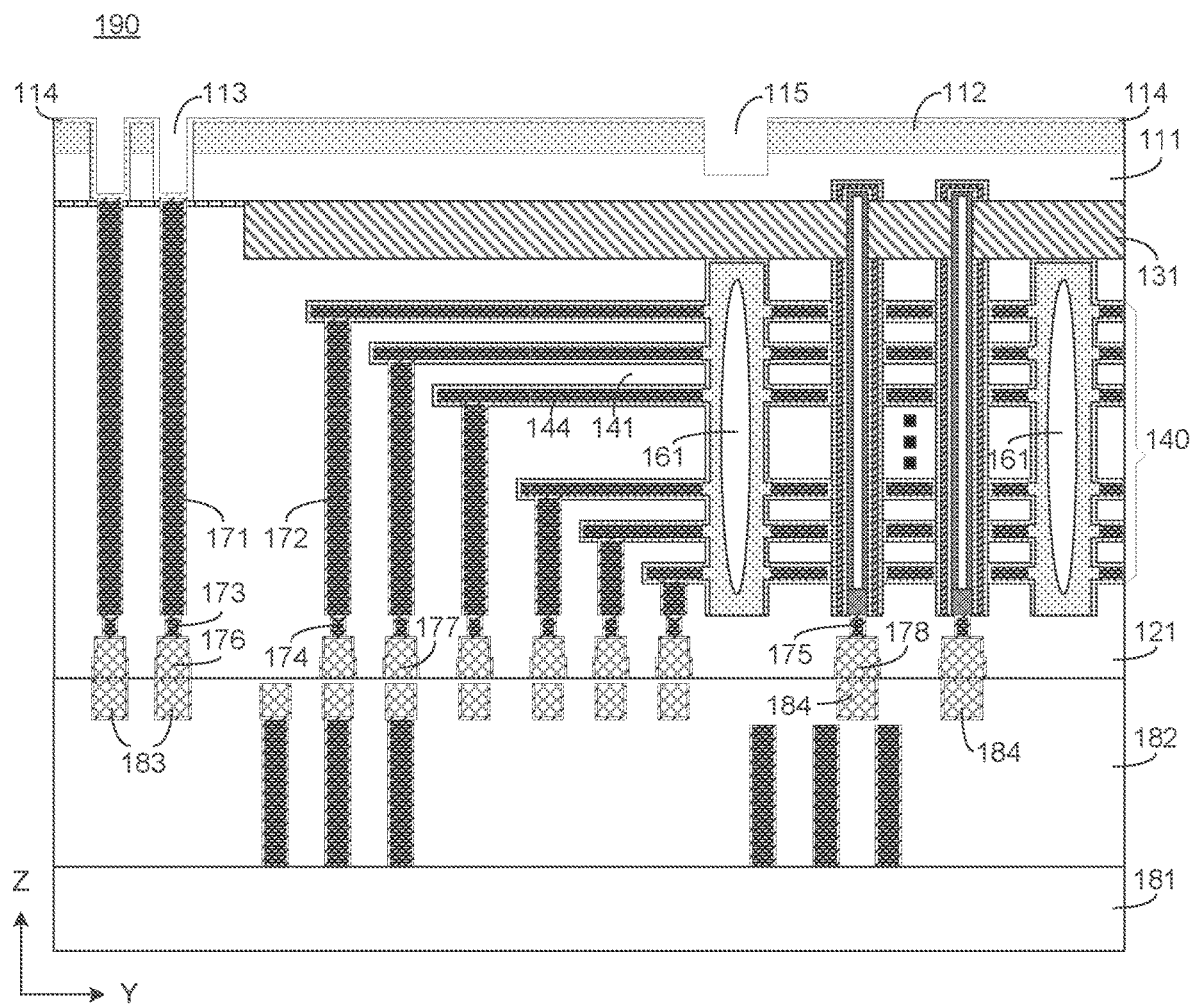

Thereafter, the substrate 110 of the 3D array device 100 may be thinned by a thinning process, such as wafer grinding, dry etch, wet etch, CMP, or a combination thereof. Then, a dielectric layer 112 may be grown over the doped region 111 by a deposition process (e.g., a CVD or PVD process). Openings 113 may be formed by a dry etch process or a combination of dry etch and wet etch processes. The openings 113 penetrate through the dielectric layer 112 and the doped region 111 and expose the peripheral contacts 171, as shown in FIG. 13. Then a dielectric material such as silicon dioxide or silicon nitride may be deposited to form a dielectric layer 114 above the dielectric layer 112 and on the sidewall and bottom of the opening 113. A deposition process such as CVD or PVD may be performed to grow the dielectric layer 114, followed by a dry etch process or dry and wet etch processes to form an opening 115 that extends through the dielectric layers 114 and 112, and partially through the doped region 111.

Figure 15:
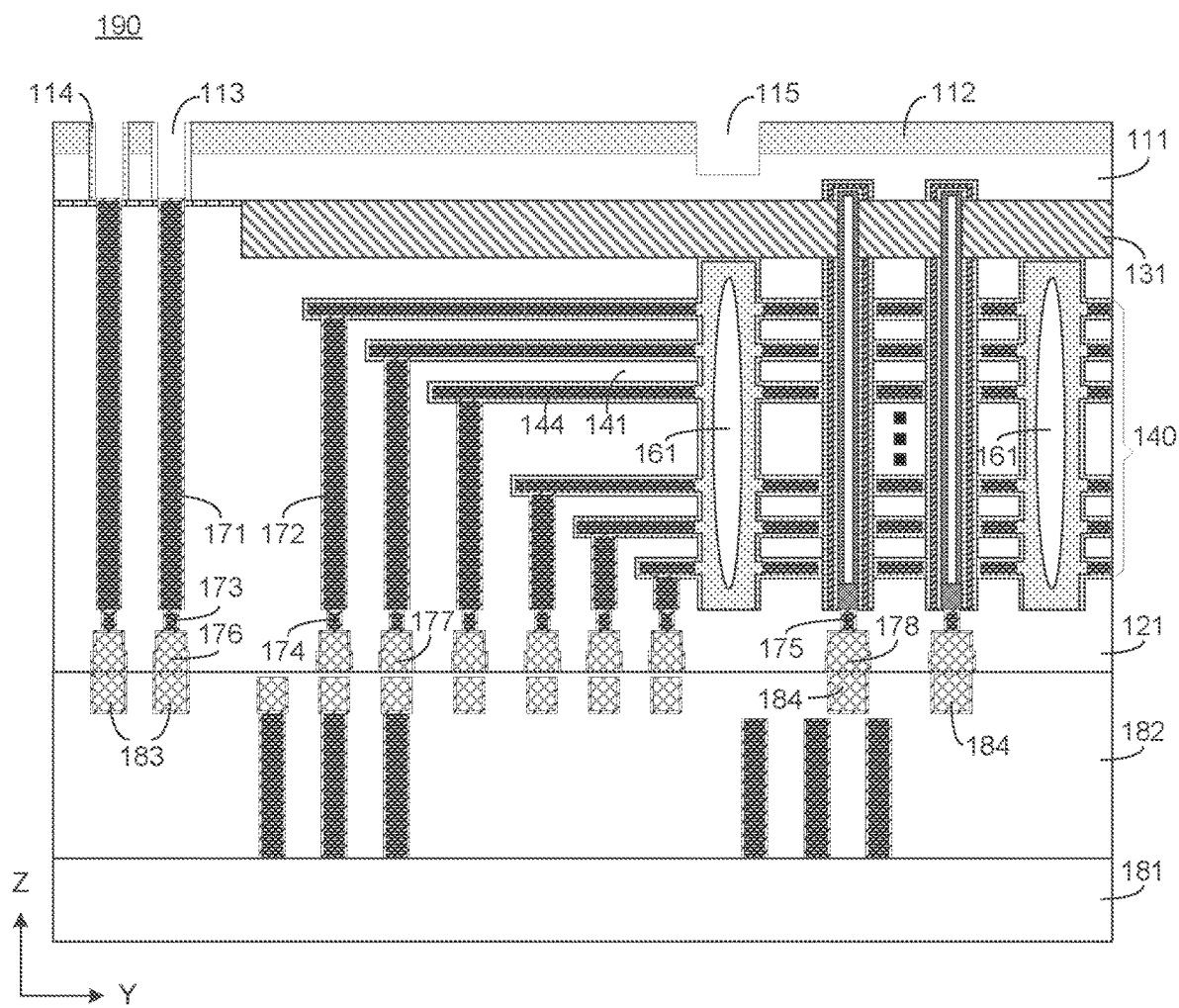
Figure 16:
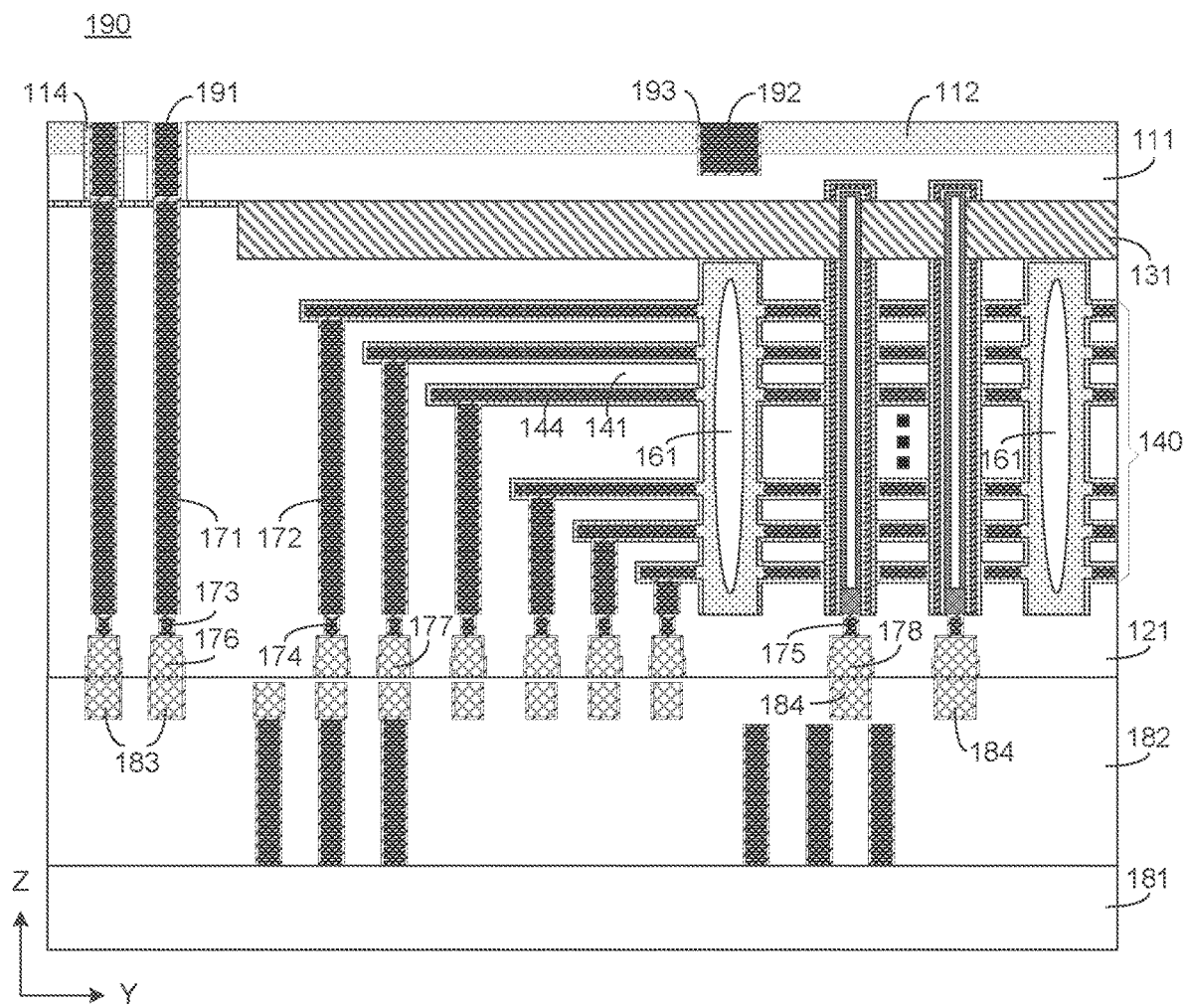

Thereafter, an etch process (e.g., a dry etch process) may be performed to remove portions of the dielectric layer 114 that are on the top of the dielectric layer 112 and the bottom surfaces of the openings 113, which is shown in FIG. 15. The openings 113 and 115 may be filled with an electrically conductive material (e.g., W, Co, Cu, Al, or a combination thereof) to form vias 191 and 192. The vias 191 and 192 may serve as contact structures and the vias 191 may also be referred to as through silicon contact (TSC). CVD, PVD, ALD, electroplating, electroless plating, or a combination thereof may be performed to form the vias 191 and 192. The vias 191 and 192 are electrically connected with the peripheral contacts 171 and the doped region 111, respectively, as shown in FIG. 16. In some embodiments, a contact layer 193 of a conductive material (e.g., titanium nitride) may be deposited first before filling the openings to form the vias 191 and 192.

Figure 17:
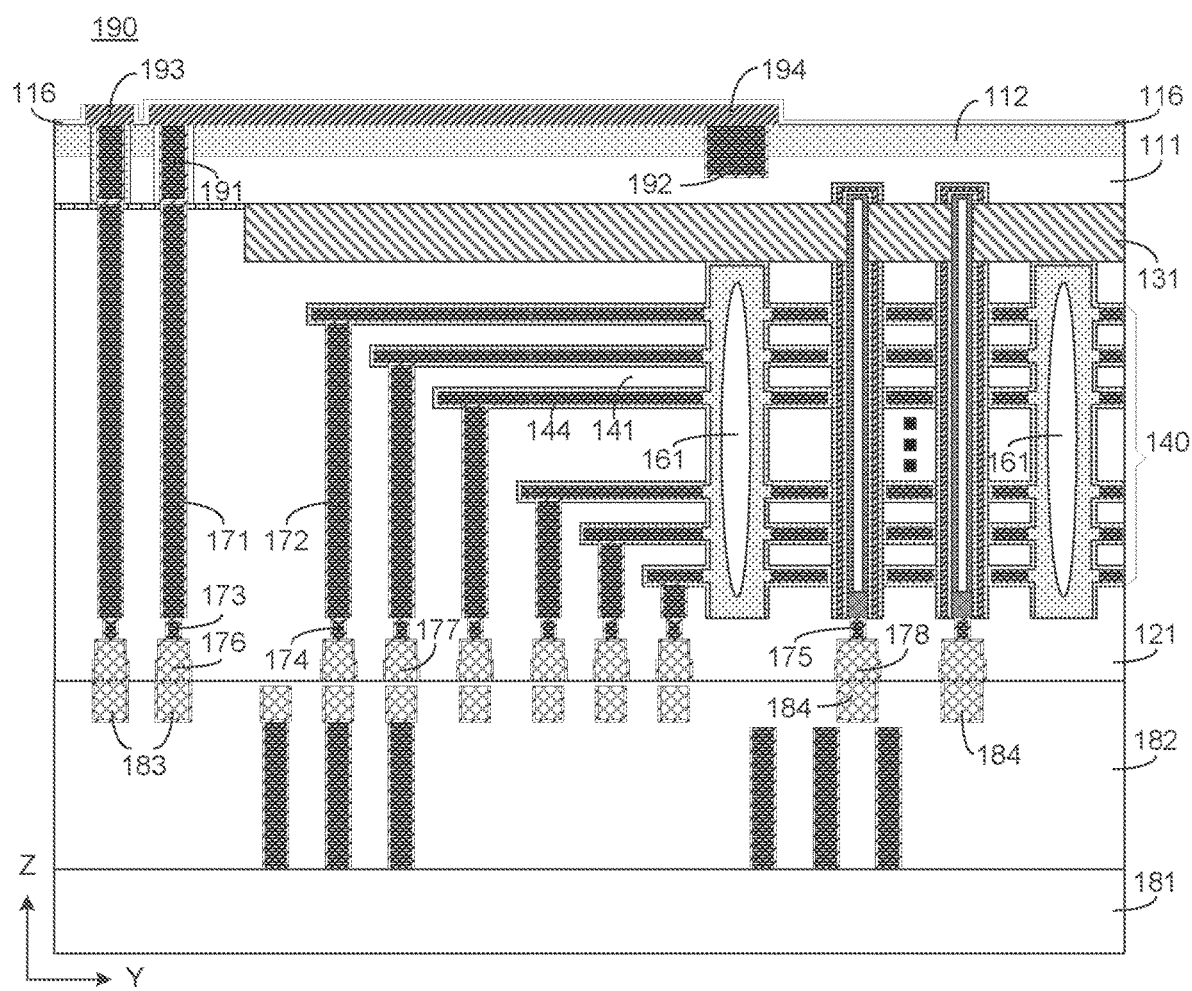

As shown in FIG. 17, metal layers 193 and 194 may be formed in a deposition process (e.g., CVD, PVD, ALD, electroplating, electroless plating, or a combination thereof). The metal layer 193 may serve as a pad layer that covers and electrically contacts one of the vias 191. The metal layer 194 electrically connects the via 192 with the other via 191. Then a dielectric layer 116 may be deposited to cover metal layers 193 and 194 and the exposed portions of the dielectric layer 112 by a process such as CVD, PVD, ALD, or a combination thereof. The dielectric layer 116 may serve as a passivation layer that may include a dielectric material such as silicon oxide, silicon nitride, silicon oxynitride, TEOS, or a combination thereof. Thereafter, an etch process (e.g., a dry or wet etch process) may be performed to remove a part of the dielectric layer 116 to expose the metal layer 193.

In some embodiments, the 3D memory device 190 may include the 3D array device 100 and multiple peripheral devices (not shown) that are the same as or similar to the peripheral device 180. In some embodiments, the 3D memory device 190 may include a peripheral device 180 and multiple 3D array devices (not shown) that are the same as or similar to the 3D array device 100. When there are multiple peripheral devices (or multiple 3D array devices), in some embodiments, the multiple peripheral devices (or 3D array devices) may be bonded with a corresponding 3D array device (or a corresponding peripheral device) sequentially in separate bonding processes. In some other embodiments, the multiple peripheral devices (or 3D array devices)

may be bonded with a corresponding 3D array device (or a corresponding peripheral device) simultaneously in one boding process.

In some embodiments, the 3D array device 100 and the peripheral device 180 may be integrated. For example, after the peripheral device 180 is fabricated, the 3D array device 100 may be fabricated over the dielectric layer 182 of the peripheral device 180. Certain vias may be made to interconnect the 3D array devices 100 and the peripheral device 180 during the fabrication process.

Figure 18:
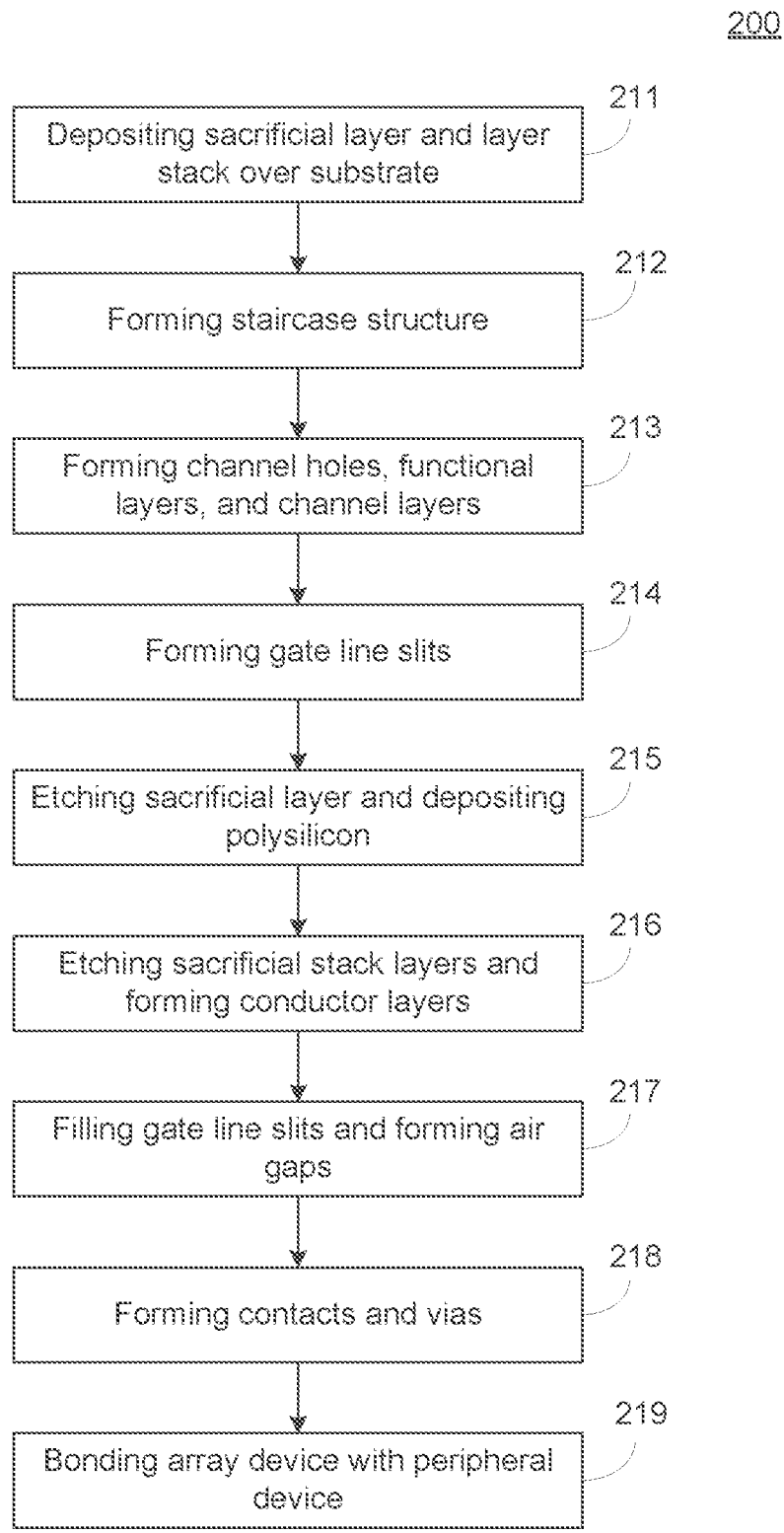
FIG. 18 illustrates a schematic flow chart of fabrication of a 3D memory device according to embodiments of the present disclosure.

FIG. 18 shows a schematic flow chart 200 for fabricating a 3D memory device according to embodiments of the present disclosure. At 211, a sacrificial layer of a 3D array device may be deposited over a top surface of a substrate. The substrate may include a semiconductor substrate, such as a single crystalline silicon substrate. In some embodiments, a cover layer may be deposited on the substrate before depositing the sacrificial layer. The cover layer may include a single layer or multiple layers that are deposited sequentially over the substrate. In some embodiments, the cover layer may include silicon oxide, silicon nitride, and/or aluminum oxide. In some other embodiments, the sacrificial layer may be deposited without first depositing the cover layer over the substrate. The sacrificial layer may include single crystalline silicon, polysilicon, silicon oxide, or silicon nitride.

Over the sacrificial layer, a layer stack of the 3D array device may be deposited. The layer stack includes a first stack layer and a second stack layer that are alternately stacked. In some embodiments, the first stack layer may include a first dielectric layer and the second stack layer may include a second dielectric layer that is different than the first dielectric layer. In some embodiments, one of the first and second dielectric layers is used as a sacrificial stack layer.

At 212, a staircase formation process may be performed to trim the layer stack formed at 211. The staircase formation process may include multiple etches that are used to convert the layer stack into a staircase structure for the 3D array device. In some embodiments, the height the staircase structure of the layer stack may decrease in a stepwise manner along a direction.

At 213, channel holes may be formed that extend through the layer stack and the sacrificial layer to expose portions of the substrate. A functional layer and a channel layer may be deposited on the sidewall and bottom surface of each channel hole. Forming the functional layer may include depositing a blocking layer on the sidewall of the channel hole, depositing a charge trap layer on the blocking layer, and depositing a tunnel insulation layer on the charge trap layer. The channel layer, deposited on the tunnel insulation layer, functions as a semiconductor channel and may include a polysilicon layer.

At 214, gate line slits of the 3D array device may be formed that extend vertically through the layer stack and into the sacrificial layer, and expose portions of the sacrificial layer. The gate line slits may also extend along a horizontal direction. Some gate line slits may be arranged to divide the NAND memory cells into multiple memory block regions. The memory block region includes a channel hole region that includes the channel holes. In some embodiments, wafer bow may be measured directly at 214. In some embodiments, wafer bow is estimated by calculation using previous records and data obtained from measurements other than the direct wafer bow detection. In some embodiments, the quantity, position, dimension, and/or profile of the gate line slits may be configured to reduce wafer bow. For example, after the status of wafer bow is obtained by the direct measurement or estimate using previous records and other data, the quantity, position, dimension, and/or profile of the gate line slits may be determined or adjusted in order to minimize wafer bow. For example, additional gate line slits may be configured.

At 215, the sacrificial layer may be etched away and a cavity may be created above the substrate. The cavity exposes a bottom portion of the blocking layer of the functional layer in the cavity. The cover layer is also exposed in the cavity, if it is deposited on the substrate. Then, the layers of the functional layer exposed sequentially in the cavity, including the blocking layer, the charge trap layer, and the tunnel insulation layer, are etched away by, e.g., one or more selective etch processes, respectively. As a result, a portion of the functional layer that is close to the substrate may be removed in the cavity. The cover layer, if deposited, also may be etched away during the process to etch the portion of the functional layer or in another selective etch process. Hence, a portion of the substrate and portions of the channel layers are exposed in the cavity.

Thereafter, a deposition process may be performed to grow a polysilicon layer in the cavity. The polysilicon layer electrically contacts the channel layers and the substrate.

In some embodiments, the layer stack includes two dielectric stack layers and one of the stack layers is sacrificial. The sacrificial stack layers may be etched away at 216 to leave cavities, which then may be filled with an electrically conductive material to form the conductor layers. The electrically conductive material may include a metal such as W, Co, Cu, or Al.

At 217, the gate line slits may be filled with a dielectric material such as silicon oxide or silicon nitride. In some embodiments, wafer bow may be measured directly before the filling process. In some embodiments, wafer bow may be estimated by calculation using past records and data obtained from measurements other than the direct wafer bow detection. In some embodiments, when the gate line slits are filled with a filling material, air gaps may be formed to reduce wafer bow. The air gaps may be surrounded or enclosed by the filling material and form a predetermined shape in the slits. In some embodiments, the quantity, position, dimension, and/or shape of the air gaps may be configured to reduce wafer bow. For example, after the status of wafer bow is obtained by direct measurement or estimate using previous records and other data, the quantity, position, dimension, and/or shape of the air gaps may be determined in order to minimize wafer bow.

At 218, etching and filling processes may be performed to form word line contacts, peripheral contacts, and vias that are electrically connected to the word line contacts and peripheral contacts. Contacts for interconnection between the 3D array device and a peripheral device also may be formed.

At 219, the flip-chip bonding process may be performed to bond the 3D array device and the peripheral device or fasten the 3D array device with the peripheral device. In some embodiments, the 3D array device may be flipped upside down and positioned above the peripheral device. The 3D array device and the peripheral device may be aligned. For example, contacts for interconnection of the 3D array device and contacts for interconnection of the peripheral device may be aligned and then bonded. After the bonding process, the 3D array device and the peripheral device are combined to form the 3D memory device.

Figure 19:
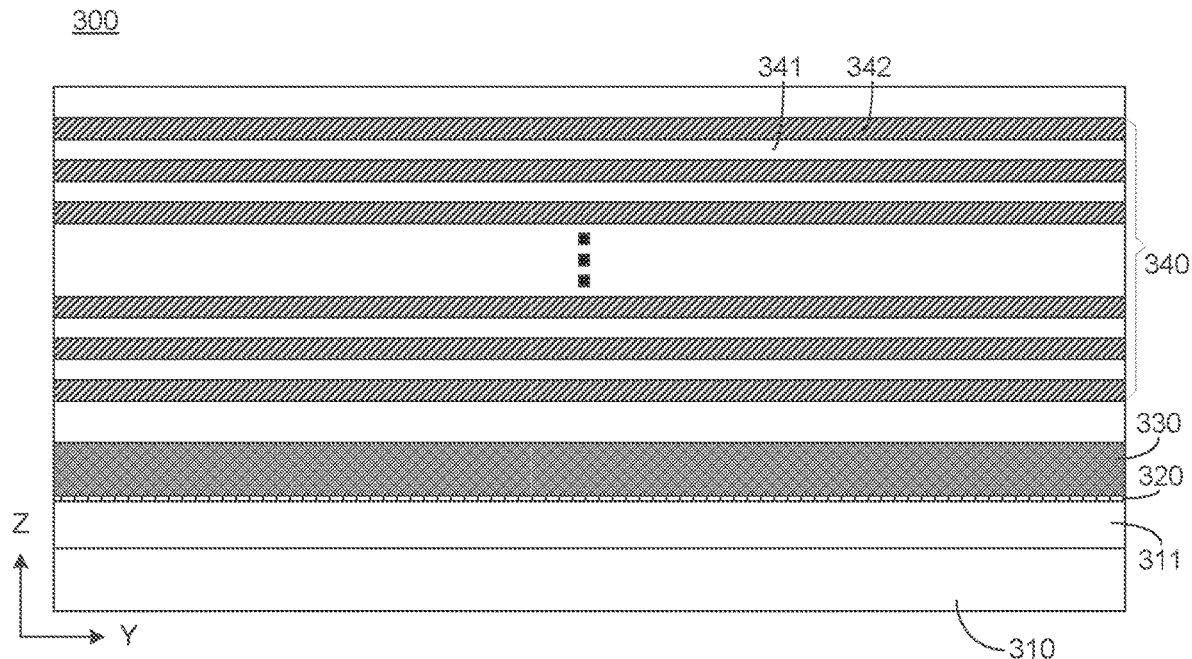
FIGS. 19 and 20 illustrate schematically cross-sectional views of another 3D array device in an exemplary fabrication process according to embodiments of the present disclosure.

FIGS. 19-24 schematically show a fabrication process of an exemplary 3D array device 300 according to embodiments of the present disclosure. Among FIGS. 19-24, the cross-sectional views are in a Y-Z plane and the top view is in an X-Y plane. As shown in FIG. 19, the 3D array device 300 includes a substrate 310. In some embodiments, the substrate 310 may include a single crystalline silicon layer. In some other embodiments, the substrate 310 may include another semiconductor material such as Ge, SiGe, SiC, SOI, GOI, polysilicon, GaAs, or InP. In the following descriptions, as an example, the substrate 310 includes an undoped or lightly doped single crystalline silicon layer.

In some embodiments, a top portion of the substrate 310 may be doped by n-type dopants via ion implantation and/or diffusion to form a doped region 311. As shown in FIG. 19, a cover layer 320 may be deposited over the doped region 311. The cover layer 320 is a sacrificial layer and may include a single layer or multiple layers. For example, the cover layer 320 may include one or more of silicon oxide layer and silicon nitride layer. The cover layer 320 may be deposited by CVD, PVD, ALD, or a combination of two or more of these methods. In some other embodiments, the cover layer 320 may include another material such as aluminum oxide.

Over the cover layer 320, a sacrificial layer 330 may be deposited. The sacrificial layer 330 may include a semiconductor material or dielectric material. In descriptions bellow, as an example, the sacrificial layer 330 is a polysilicon layer. After the sacrificial layer 330 is formed, a layer stack 340 may be deposited. The layer stack 340 includes multiple pairs of stack layers 341 and 342, i.e., the stack layers 341 and 342 are stacked alternately.

In some embodiments, the stack layers 341 and 342 may include a first dielectric material and a second dielectric material that is different from the first dielectric material, respectively. The alternating stack layers 341 and 342 may be deposited via CVD, PVD, ALD, or a combination of two or more of these processes. In discussions bellow, exemplary materials for the stack layers 341 and 342 are silicon oxide and silicon nitride, respectively. The silicon oxide layer may be used as an isolation stack layer and the silicon nitride layer may be used as a sacrificial stack layer.

Figure 20:
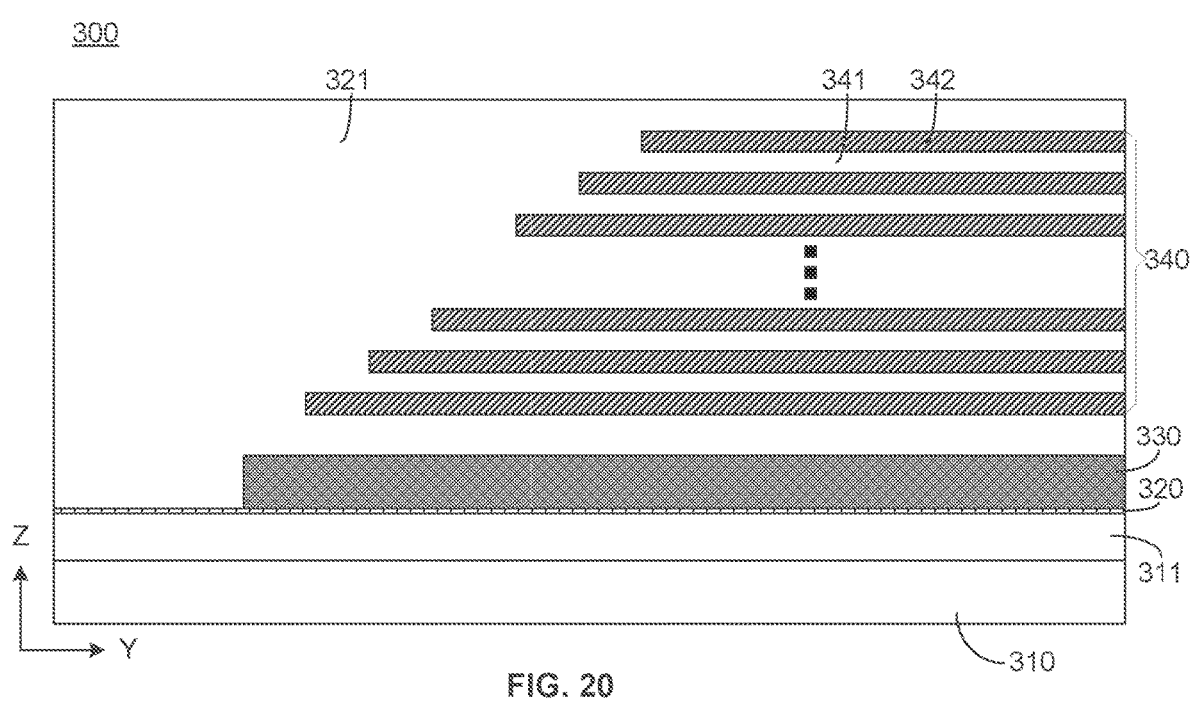

After the layer stack 340 is deposited, a staircase formation process may be performed to trim the layer stack 340 into a staircase structure, as shown in FIG. 20. Then, the staircase structure may be covered by a dielectric material such as silicon oxide that forms a dielectric layer 321.

Figure 21:
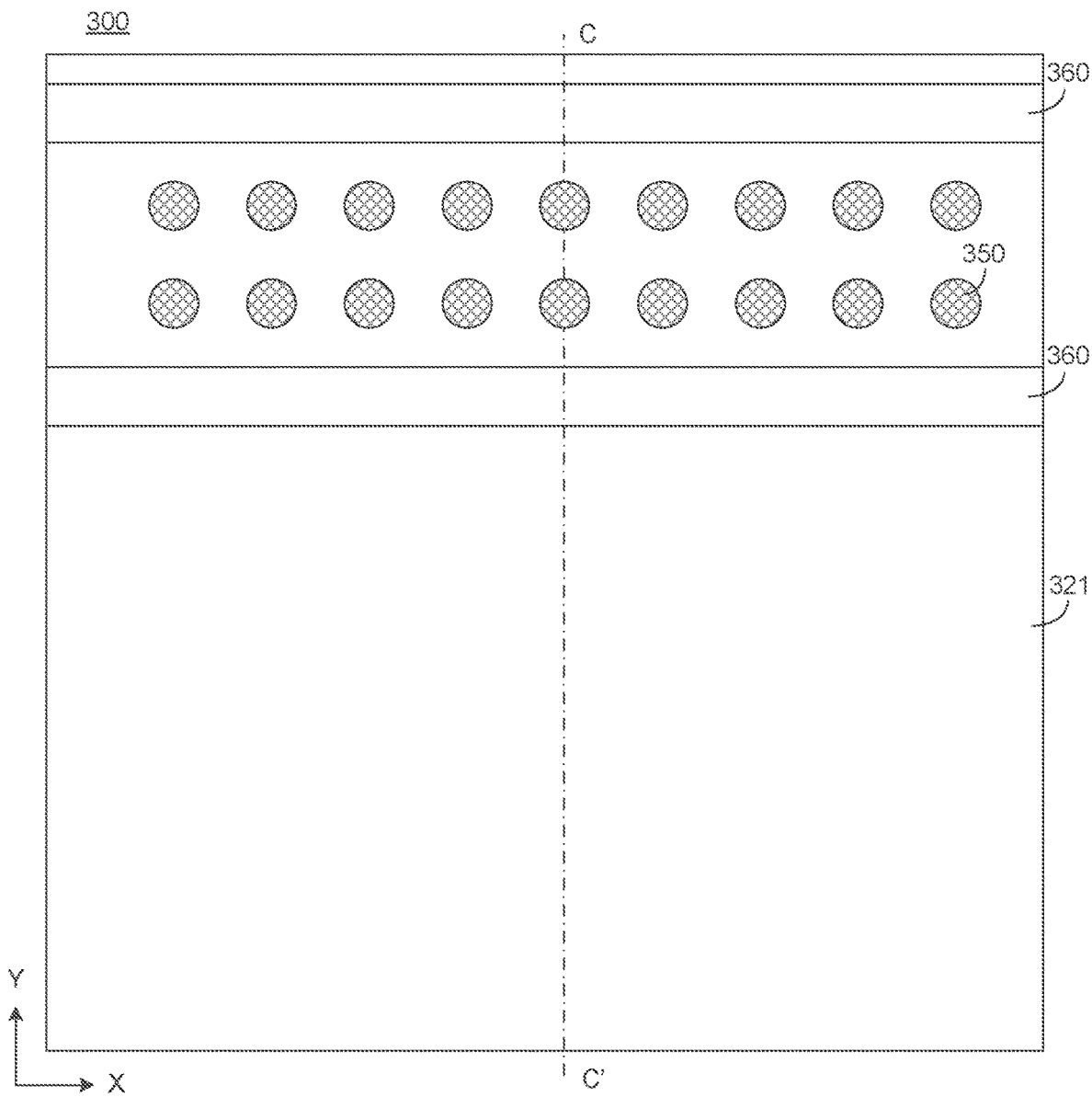
FIGS. 21 and 22 illustrate schematically a top view and a cross-sectional view of the 3D array device shown in FIGS. 19 and 20 after channel holes and gate line slits are formed according to embodiments of the present disclosure.
Figure 22:
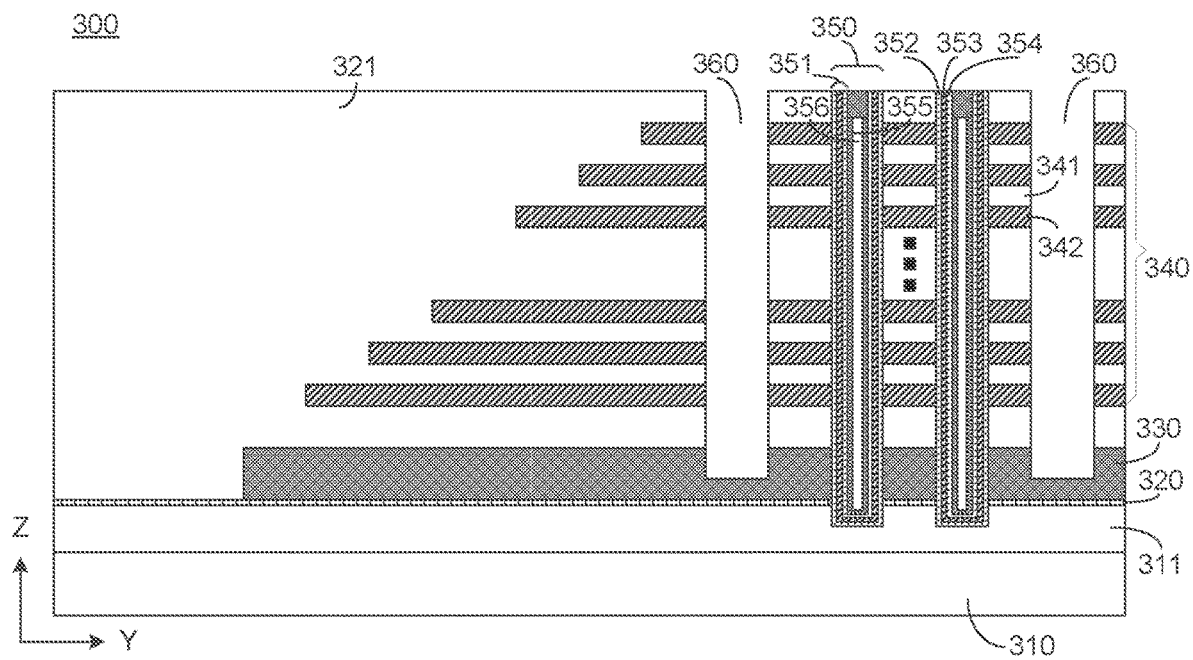

FIGS. 21 and 22 schematically show a top view and a cross-sectional view of the 3D array device 300 after some processes according to embodiments of the present disclosure. Channel holes 350 may be formed in the layer stack 340. The quantity, dimension, and arrangement of the channel hole 350 shown in FIGS. 21 and 22 are exemplary and for description of structures and fabrication methods of the 3D array device 300. The channel holes 350 are configured to extend in the Z direction and form an array of a predetermined pattern in the X-Y plane. The cross-sectional view shown in FIG. 22 is taken along a line CC' of FIG. 21.

The channel holes 350 may have a cylinder shape or pillar shape that extends through the layer stack 340, the sacrificial layer 330, and the cover layer 320, and partially penetrates the doped region 311. After the channel holes 350 are formed, a functional layer 351 may be deposited on the sidewall and bottom of the channel hole. The functional layer 351 may include a blocking layer 352 on the sidewall and bottom of the channel hole to block an outflow of charges, a charge trap layer 353 on a surface of the blocking layer 352 to store charges, and a tunnel insulation layer 354 on a surface of the charge trap layer 353.

In some embodiments, the functional layer 351 may include an ONO structure, which is used in descriptions below. As shown in FIG. 22, a silicon oxide layer may be deposited on the sidewall of the channel hole 350 as the blocking layer 352. A silicon nitride layer may be deposited on the blocking layer 352 as the charge trap layer 353. Another silicon oxide layer may be deposited on the charge trap layer 353 as the tunnel insulation layer 354. On the tunnel insulation layer 354, a polysilicon layer may be deposited as a channel layer 355. Like the channel holes, the channel layer 355 also extends through the layer stack 340 and into the doped region 311. The channel holes 350 may be filled by an oxide material 356 after the channel layers 355 are formed. The channel hole 350 may be sealed by a plug that includes an electrically conductive material (e.g., metal W) and electrically contacts the channel layer 355.

After the functional layers 351 and channel layers 355 are deposited, wafer bow of the 3D device 300 may be measured directly or estimated using data available and past records. Then, the quantity, position, dimension, and/or profile of gate line slits 360 may be determined to reduce wafer bow.

In some embodiments, the dimensions and shapes of the gate line slits may be the same. In some other embodiments, the dimensions and shapes of the gate line slits may be arranged differently to reduce wafer bow. For example, the maximum slit width of one gate line slit may be different than that of another gate line slit in the Y direction.

The gate line slits 360 may be formed by, e.g., a dry etch process or a combination of dry and wet etch processes. As shown in FIG. 22, the gate line slits 360 may extend through the layer stack 340 and reach or partially penetrate the sacrificial layer 330 in the Z direction. As such, at the bottom of the gate line slits 360, parts of the sacrificial layer 330 are exposed. Then, spacer layers (not shown) may be deposited on the sidewall and bottom of the gate line slit 360. The spacer layers are configured to protect the stack layers 341 and 342 and may include, for example, silicon oxide and silicon nitride.

Portions of the spacer layers at the bottom of the slits 360 may be removed by etch to expose the sacrificial layer 330. Then the sacrificial layer 330 is etched out. Removal of the sacrificial layer 330 creates a cavity and exposes the cover layer 320 and bottom portions of the blocking layers 352 formed in the channel holes 350. Next, portions of the blocking layer 352, the charge trap layers 353, and the tunnel insulation layer 354 are etched away, exposing bottom portions of the channel layer 355. The cover layer 320 may be removed when the bottom portions of the functional layer 351 are etched away or in an additional selective etch process, exposing the top surface of the doped region 311.

Then the cavity may be filled by a semiconductor material, e.g., polysilicon, to form a semiconductor layer 331 by a deposition process such as a CVD and/or PVD process. In some embodiments, the semiconductor layer 331 may be doped by n-type dopants to form an n-well region and deposited on surfaces of the exposed portions of the doped region 311 and the channel layer 355. The semiconductor layer 331 is electrically connected to the doped region 311 and the channel layer 355.

After the semiconductor layer 331 is formed, the stack layers 342 may be removed by etch and replaced by conductor layers 344 that includes an electrically conductive material such as W.

Each conductor layer 344 is configured to electrically connect one or more rows of NAND memory cells along the Y direction or in the X-Y plane and is configured as a word line for the 3D array device 300. The channel layer 355 formed in the channel hole 350 is configured to electrically connect a NAND string along the Z direction and configured as a bit line for the 3D array device 300. The 3D array device 300 includes a 2D array of NAND strings. A portion of the conductor layer 344 that is around a portion of the channel hole 350 may function as a control gate or gate electrode for a NAND memory cell.

In some embodiments, after the conductor layers 344 are formed, wafer bow of the device 300 may be measured and filling of the gate line slits 360 may be used to decrease wafer bow. In some other embodiments, wafer bow may be estimated using data available and previous records without direct measurement on wafer bow. The data that may be used for bow estimate may include materials used, processes performed, and measurement results other than bow detection data. The previous records may include measurement records and bow reduction solutions obtained in the past.

Figure 23A:
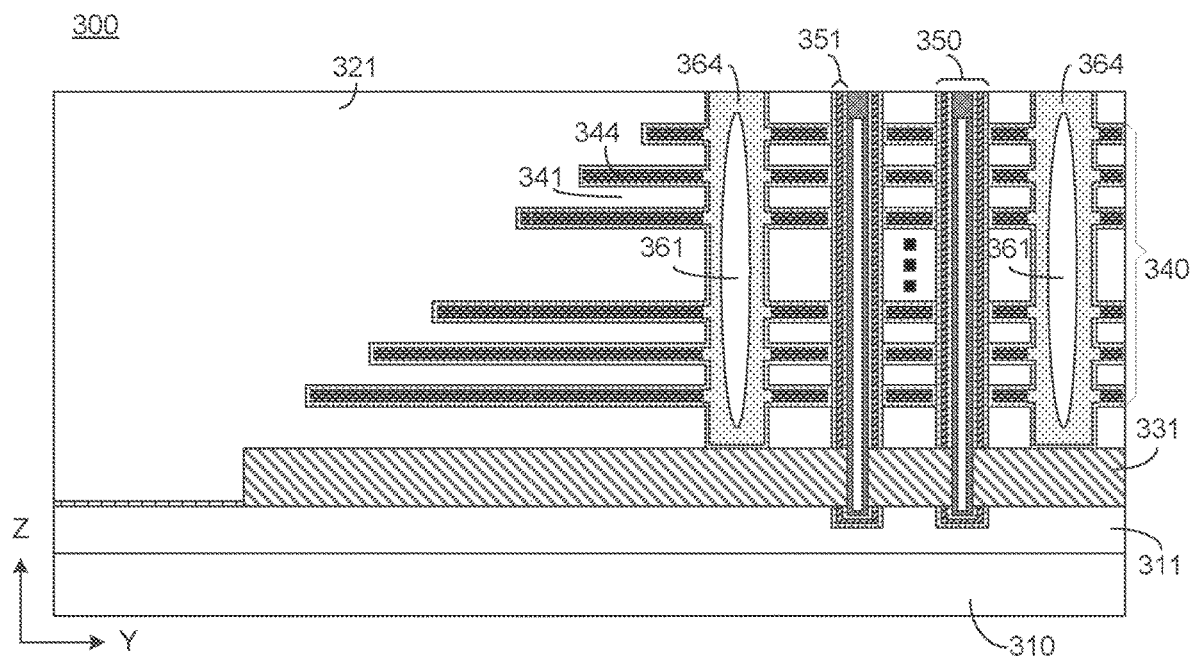
FIGS. 23A, 23B, and 23C illustrate schematically cross-sectional views of the 3D array device shown in FIGS. 21 and 22 after air gaps are formed according to embodiments of the present disclosure.
Figure 23B:
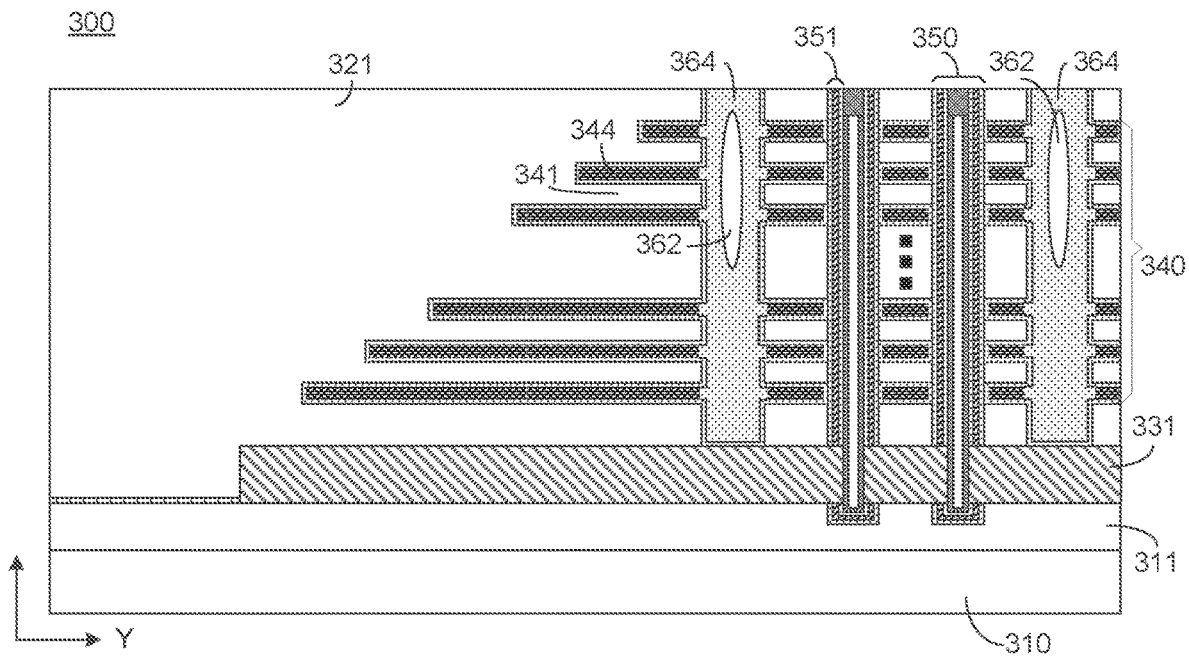
Figure 23C:
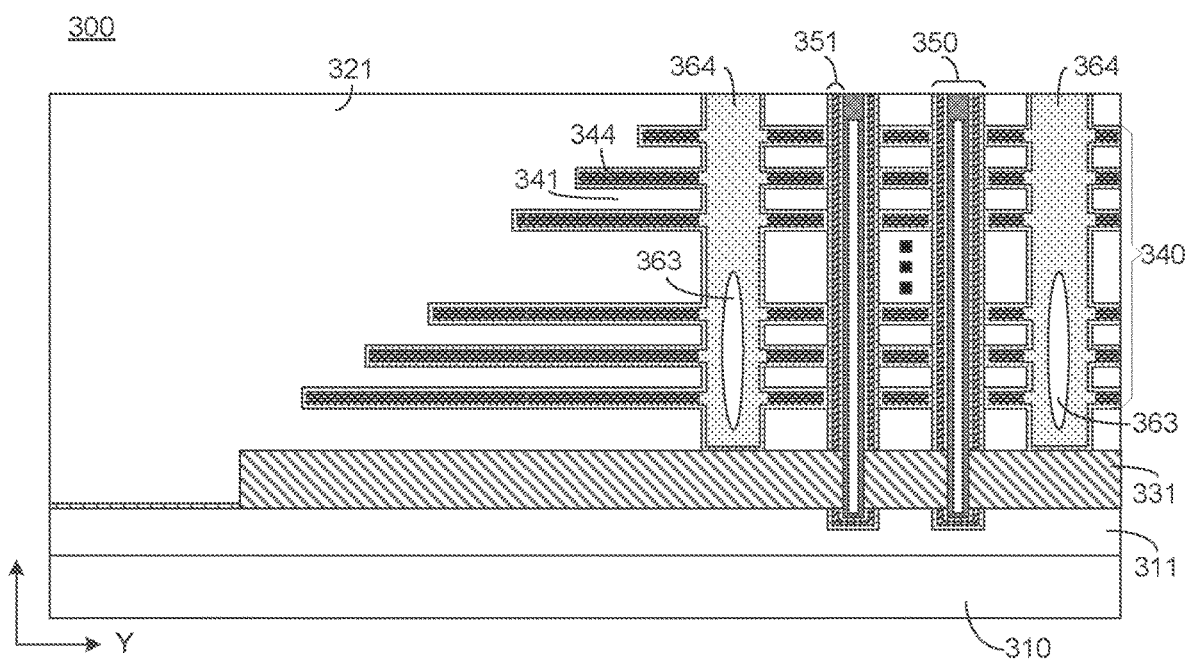

Gate line slits 360 may be filled with a dielectric material 364 such as silicon oxide, silicon nitride, another dielectric material, or a combination of two or more of these materials. During the filling process, air gaps 361 may be formed, as shown in FIG. 23A. The position, dimension, quantity, and shape of the air gap 361 may be configured using measurement results or estimate results to reduce wafer bow. For example, the maximum width of the air gap 361 in the Y direction may be equal to or larger than a width value that may be calculated using the measurement results or estimate results to reduce wafer bow. Similarly, the extension of the air gap 361 in the Z direction also may be used to reduce wafer bow. For example, the air gap 361 may extend vertically through the layer stack 340 with the bottom of the air gap 361 close to the bottom of the gate line slit 360 and the top of the air gap 361 close to the top of the gate line slit 360. In another example, the air gaps may be formed to extend vertically through an upper portion of the layer stack 340, such as air gaps 362 shown in FIG. 23B, or the air gaps may be formed to extend vertically through a lower portion of the layer stack 340, such as air gaps 363 shown in FIG. 23C. Hence, the air gaps may be configured at different positions of the gate line slit 360 with different shapes and spans to minimize wafer bow. In some other embodiments, multiple air gaps may be formed in a gate line slit to minimize wafer bow.

In some embodiments, the air gaps of the 3D array device 300 may have the same or similar positions, shapes, and dimensions to reduce wafer bow. In some embodiments, the air gaps of the 3D array device 300 may have different positions, shapes, and/or dimensions to reduce wafer bow. In some embodiments, some gate line slits may have one or more air gaps and some gate line slits may not have an air gap or only have a tiny air gap. The air gaps may be formed using CVD, PVD, ALD, or a combination of two or more of these processes. For the following fabrication processes of the 3D array device 300, the air gap 361 will be used as an example.

After the gate line slits 360 are filled, openings for peripheral contacts 371, word line contacts 372, and a source contact 3791 may be formed. The openings for contacts 371, 372, and 3791 are then filled with a conductive material such as W, Co, Cu, Al, or a combination thereof. In some embodiments, a layer of a conductive material (e.g., titanium nitride) may be deposited as a contact layer before another conductive material is deposited when the contacts 371, 372, and 3791 are fabricated.

Next, a dielectric material (e.g., silicon oxide or silicon nitride) may be deposited on the 3D array device 300. The dielectric layer 321 becomes thicker. Vias 373, 374, and 375 may be formed for the contacts 371, 372, and the bit line contacts, respectively. A via also may be made for the source contact 3791.

Figure 24:
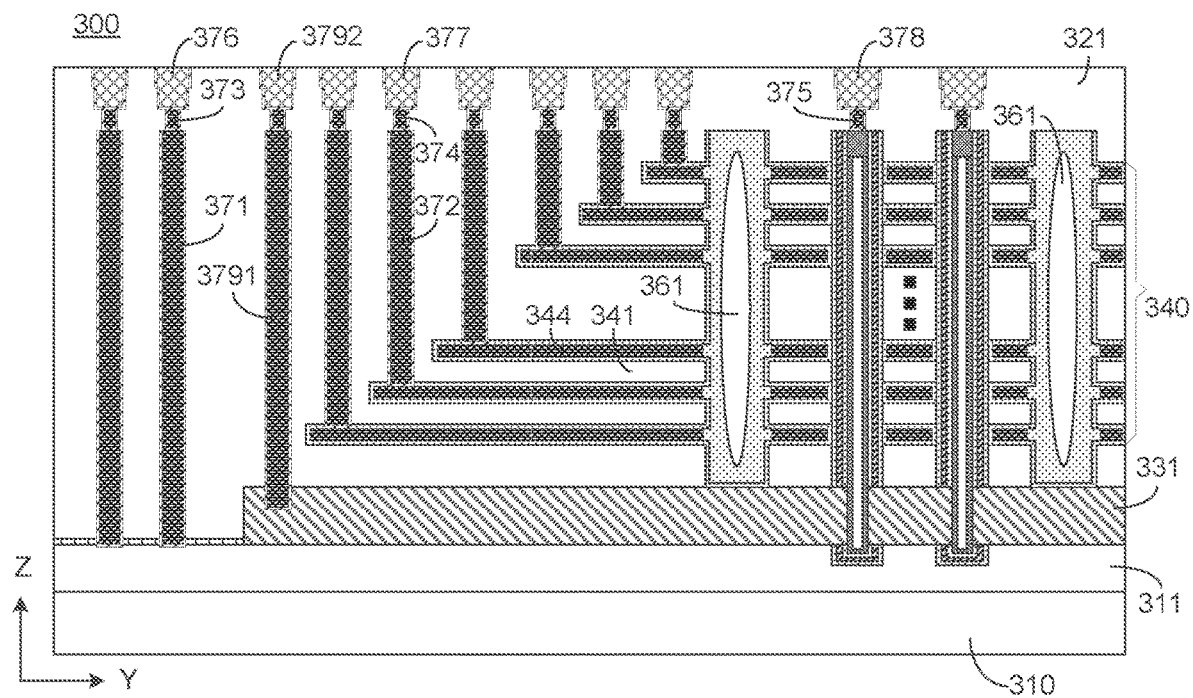
FIG. 24 illustrates schematically a cross-sectional view of the 3D array device shown in FIG. 23A after certain contacts are formed according to embodiments of the present disclosure.

Then a dielectric material (e.g., silicon oxide or silicon nitride) may be deposited to bury the vias such as the vias 373-375 and further makes the dielectric layer 321 thicker. Contacts 376, 377, 378, and 3792 may be formed that serve as interconnects with a peripheral device. As shown in FIG. 24, the contacts 376-378 are electrically connected to vias 373, 374, 375, respectively. The contact 3792 is electrically connected to the via of the source contact 3791. The contacts 376-378 and 3792 and the vias may include an electrically conductive material such as W, Co, Cu, Al, or a combination thereof.

Figure 25:
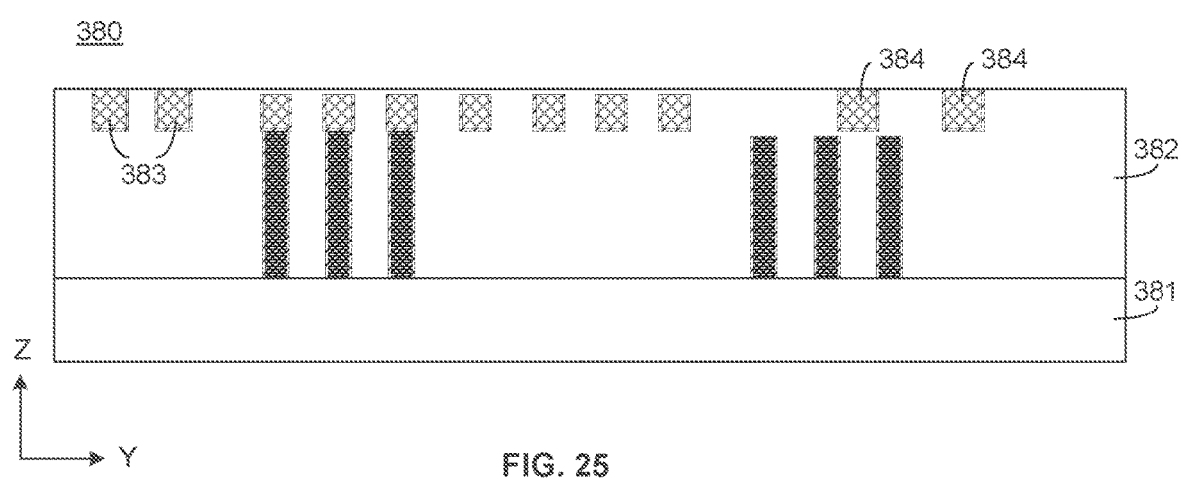
FIG. 25 illustrates schematically a cross-sectional view of a peripheral device according to embodiments of the present disclosure.

FIG. 25 schematically shows a peripheral device 380 in a cross-sectional view according to embodiments of the present disclosure. The peripheral device 380 may include a semiconductor substrate 381 (e.g., a substrate of single crystalline silicon). Peripheral circuits (e.g., control circuits) (not shown) may be fabricated on the substrate 381 and used for facilitating the operation of the 3D array device 300. A dielectric layer 382, contacts 383 and 384, and vias may be formed over the substrate 381. The contract 383 and 384 are configured for interconnecting with the 3D array device 300 and may include an electrically conductive material (e.g., W, Co, Cu, Al, or a combination thereof).

Figure 26:
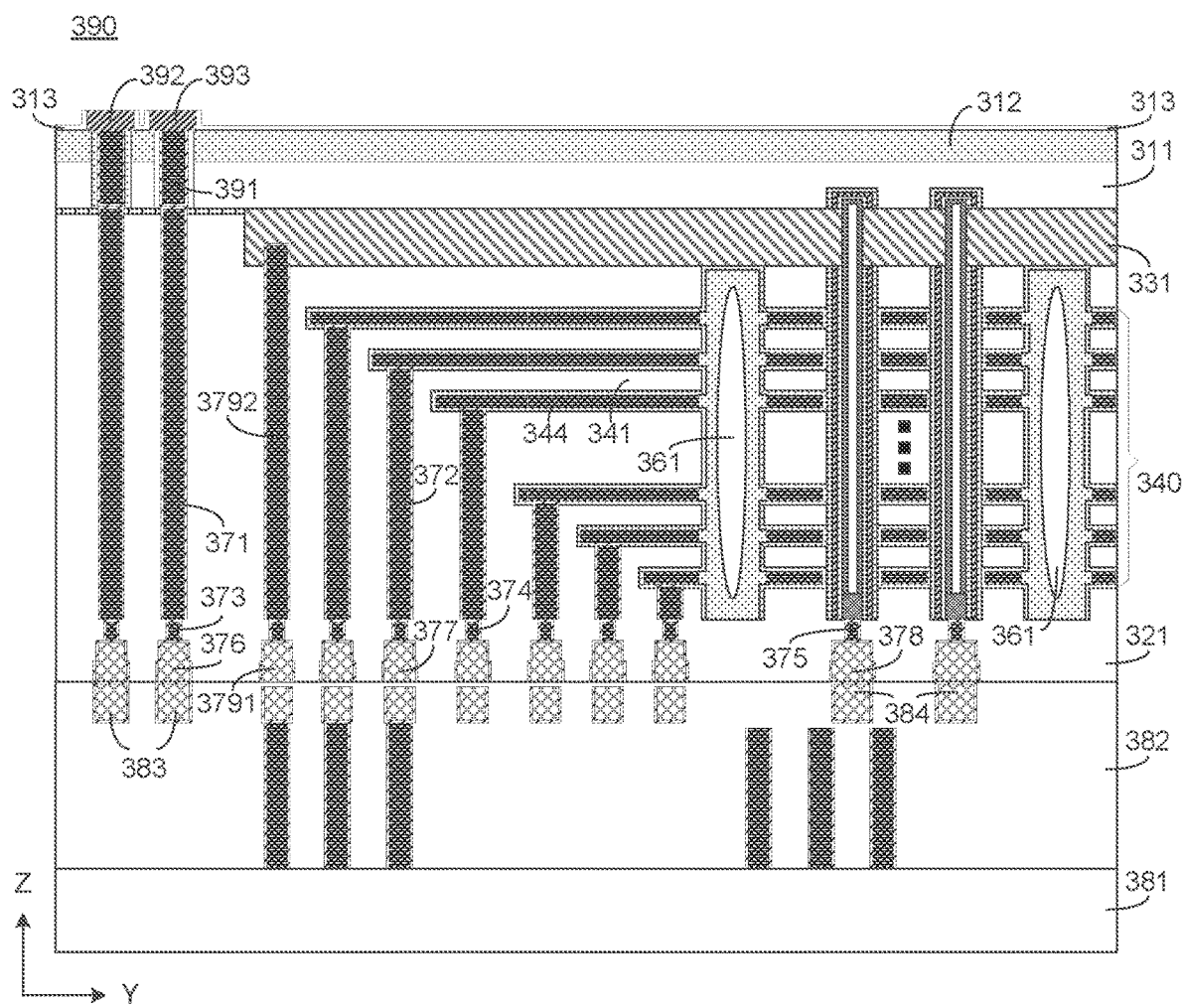
FIG. 26 illustrates schematically a cross-sectional view of another 3D memory device after the 3D array device shown in FIG. 24 is bonded with the peripheral device shown in FIG. 25 according to embodiments of the present disclosure.

FIG. 26 schematically shows an exemplary 3D memory device 390 in a cross-sectional view according to embodiments of the present disclosure. The 3D memory device 390 may include the 3D array device 300 shown in FIG. 24 and the peripheral device 380 shown in FIG. 25. The 3D array device 300 and peripheral device 380 may be bonded by the flip-chip bonding method. In some embodiments, the 3D array device 300 may be flipped upside down and then placed above the peripheral device 380. After an alignment step is made, e.g., the contacts 376 and 378 are aligned with the contacts 383 and 384, respectively, the 3D array device 300 and peripheral device 380 may be joined and bonded. In some embodiments, a solder or an electrically conductive adhesive may be used to bond the contacts 376 with the contacts 383 and bond the contacts 378 with the contacts 384. As such, the contacts 376 are electrically connected to the contacts 383, respectively and the contacts 378 are electrically connected to the contacts 384, respectively. The 3D array device 300 and peripheral device 380 are in electrical communication after the flip-chip bonding process is implemented.

Then, the substrate 310 of the 3D array device 300 may be thinned by a thinning process. A dielectric layer 312 may be deposited over the layer 311. Vias 391, serving as TSC, may be formed that penetrate the dielectric layer 312 and the doped region 311 and electrically contact the peripheral contacts 371, respectively. Pad layers 392 and 393 may be formed over the vias 391 and in contact with the vias 391, respectively. The vias 391 and pad layers 392 and 393 may be deposited using an electrically conductive material such as W, Co, Cu, Al, or a combination thereof. CVD, PVD, ALD, electroplating, electroless plating, or a combination thereof may be performed.

Over the dielectric layer 312 and the pad layers 392, and 393, a dielectric layer 313 may be deposited by a process such as CVD, PVD, ALD, or a combination thereof. The dielectric layer 313 may serve as a passivation layer that may include a dielectric material such as silicon oxide, silicon nitride, silicon oxynitride, TEOS, or a combination thereof. Subsequently, an etch process (e.g., a dry or wet etch process) may be performed to remove some parts of the dielectric layer 313 to expose the pad layers 392 and 393.

Figure 27:
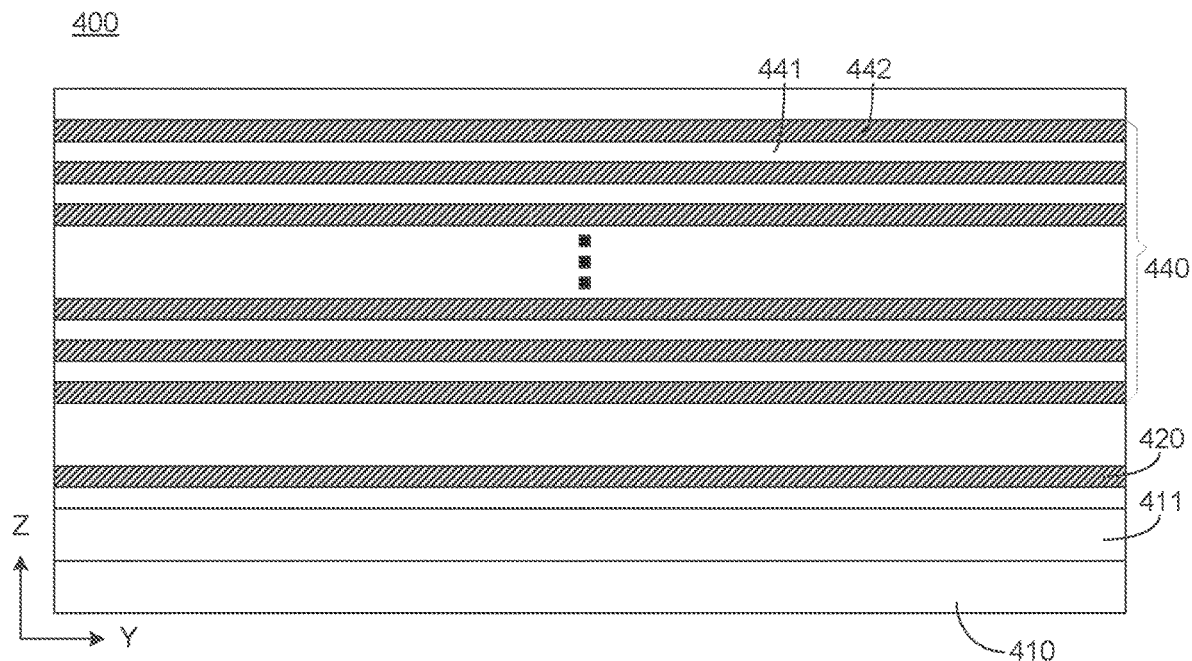
FIGS. 27 and 28 illustrate schematically cross-sectional views of another 3D array device in an exemplary fabrication process according to embodiments of the present disclosure.

FIGS. 27-32 schematically show a fabrication process of an exemplary 3D array device 400 according to embodiments of the present disclosure. As shown in FIG. 27, the 3D array device 400 includes a substrate 410. The substrate 410 may include a single crystalline silicon layer. In some other embodiments, the substrate 410 may include another semiconductor material such as Ge, SiGe, SiC, SOI, GOI, polysilicon, GaAs, or InP. In the following descriptions, as an example, the substrate 410 includes an undoped or lightly doped single crystalline silicon layer. In some embodiments, a top portion of the substrate 410 may be doped by p-type dopants via ion implantation and/or diffusion to form a doped region 411.

Over the doped region 411, a sacrificial layer 420 and a layer stack 440 may be deposited. The layer stack 440 includes multiple pairs of stack layers 441 and 442, i.e., the stack layers 441 and 442 are stacked alternately. In some embodiments, the stack layers 441 and 442 may include a first dielectric material and a second dielectric material that is different from the first dielectric material, respectively. The sacrificial layer 420 and stack layer 442 may have the same material. The sacrificial layer 420 and stack layers 441 and 442 may be deposited via CVD, PVD, ALD, or a combination thereof. In discussions bellow, exemplary materials for the stack layers 441 and 442 are silicon oxide and silicon nitride, respectively. The stack layer 441 may be used as an isolation stack layer and the stack layer 442 may be used as a sacrificial stack layer.

Figure 28:
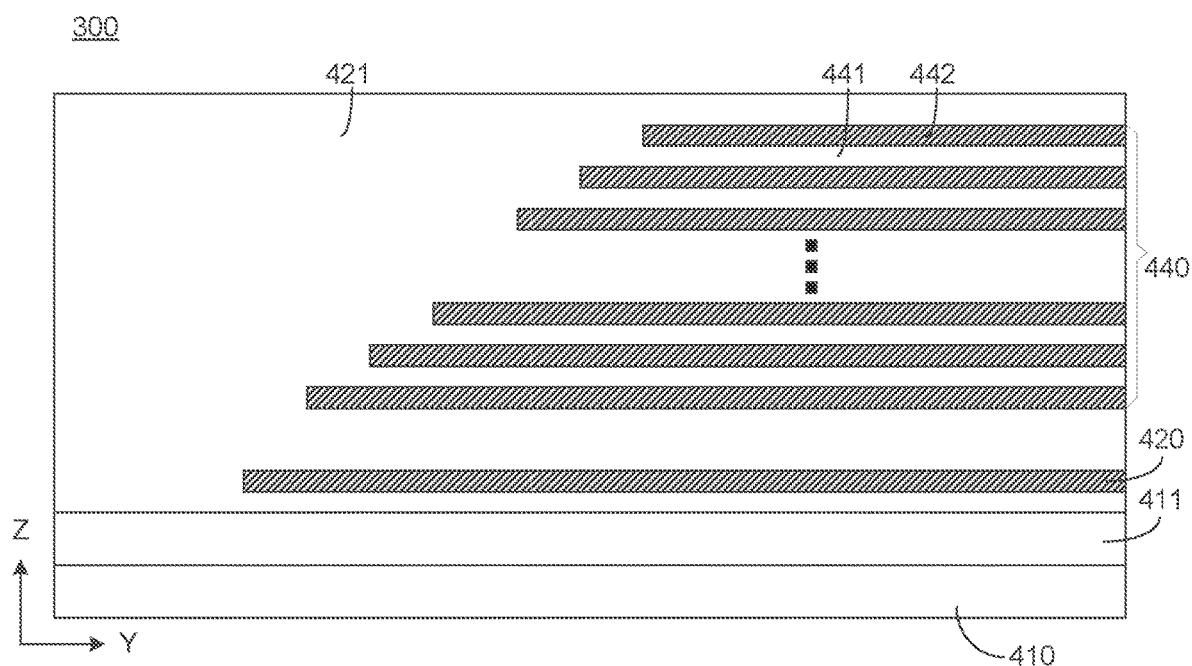

After the layer stack 440 is deposited, a staircase formation process may be performed to trim the layer stack 440 into a staircase structure, as shown in FIG. 28. Thereafter, the staircase structure may be covered by a dielectric material such as silicon oxide that forms a dielectric layer 421.

Figure 29:
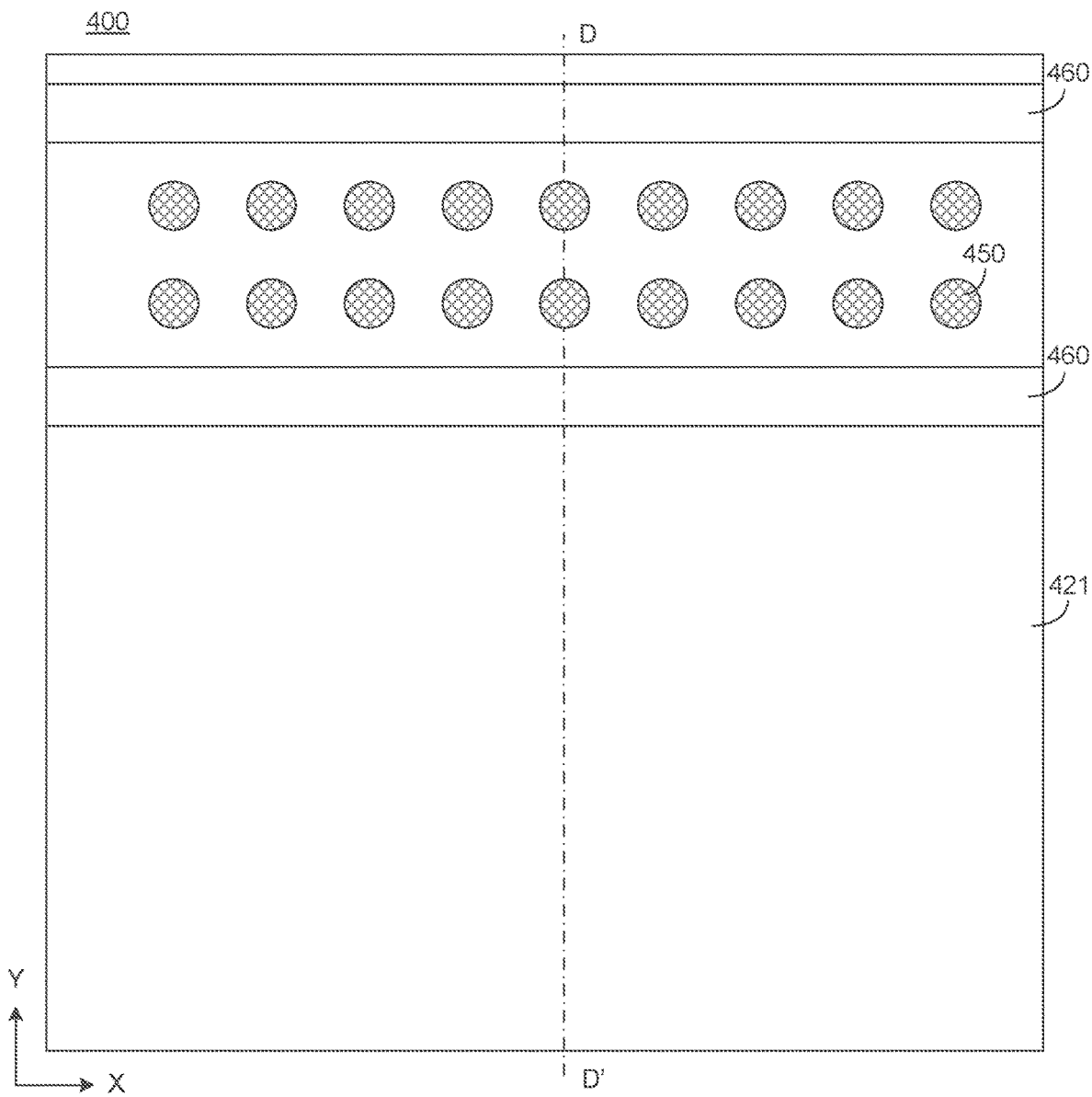
FIGS. 29 and 30 illustrate schematically a top view and a cross-sectional view of the 3D array device shown in FIGS. 27 and 28 after channel holes and gate line slits are formed according to embodiments of the present disclosure.
Figure 30:
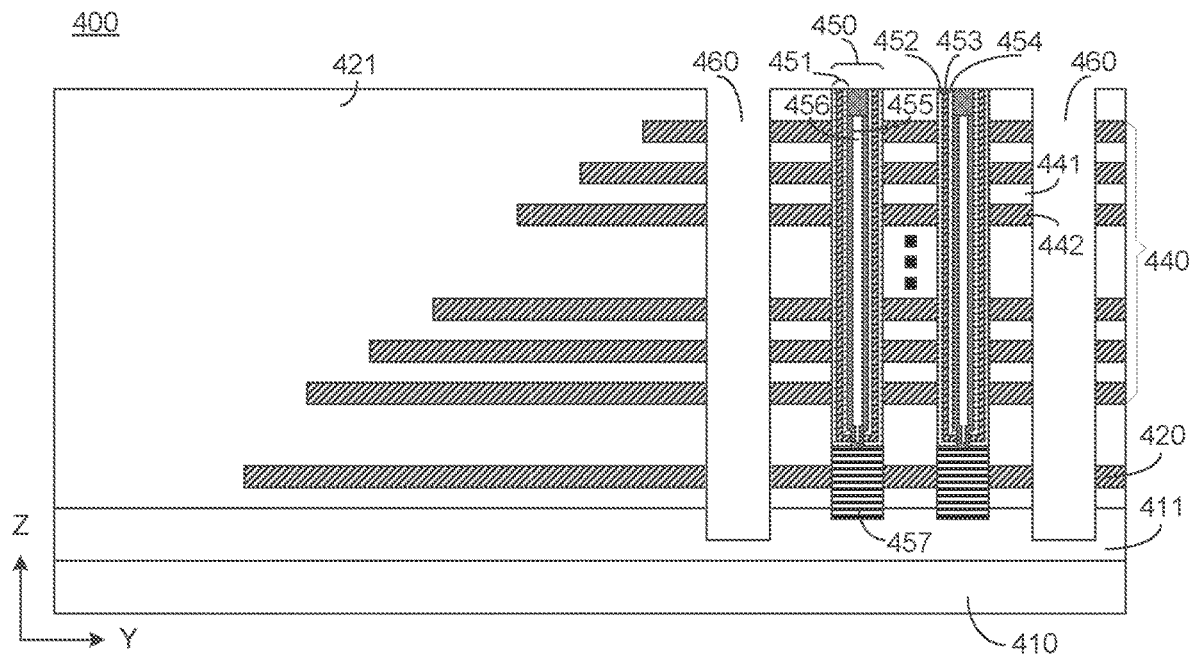

FIGS. 29 and 30 schematically show a top view and a cross-sectional view of the 3D array device 400 after some processes according to embodiments of the present disclosure. Channel holes 450 are formed in the layer stack 440. The quantity, dimension, and arrangement of the channel hole 450 shown in FIGS. 29 and 30 are exemplary and for description of structures and fabrication methods of the 3D array device 400. The channel holes 450 are configured to extend in the Z direction and form an array of a predetermined pattern in the X-Y plane. The cross-sectional view shown in FIG. 30 is taken along a line DD' of FIG. 29.

The channel holes 450 may have a cylinder shape or pillar shape that extends through the layer stack 440 and the sacrificial layer 420, and partially penetrates the doped region 411 along a direction approximately perpendicular to the substrate 410. After the channel holes 450 are formed, the doped region 411 is exposed at the bottom of the channel hole. In some embodiments, an epitaxial growth process may be performed to grow an epitaxial layer 457 from the doped region 411. The epitaxial layer 457 may extend from the doped region 411 to a region between the layer stack 440 and the sacrificial layer 420. In some embodiments, the epitaxial layer 457 may be a single crystalline silicon layer that electrically contacts the doped region 411.

Thereafter, a functional layer 451 may be deposited on the sidewall of the channel hole 450 and the top surface of the epitaxial layer 457. The functional layer 451 may include a blocking layer 452 on the sidewall of the channel hole 450 and the top surface of the epitaxial layer 457, a charge trap layer 453 on a surface of the blocking layer 452, and a tunnel insulation layer 454 on a surface of the charge trap layer 453.

In some embodiments, the functional layer 451 may include an ONO structure, which is used in descriptions below. As shown in FIG. 30, a silicon oxide layer may be deposited as the blocking layer 452. A silicon nitride layer may be deposited on the blocking layer 452 as the charge trap layer 453. Another silicon oxide layer may be deposited on the charge trap layer 453 as the tunnel insulation layer 454.

A part of the functional layer on the top of the epitaxial layer 457 may be removed by etch (e.g., a selective dry etch process) to expose a portion of the epitaxial layer 457. Then, a polysilicon layer may be deposited as a channel layer 455. The channel layer 455 may be deposited on the tunnel insulation layer 454 and the exposed portion of the epitaxial layer 457. As such, the channel layer 455 electrically contacts the epitaxial layer 457 and extends through the layer stack 440. The channel holes 450 may be filled by an oxide material 456 after the channel layers 455 are formed.

As the formation of layer stack 440 and channel holes 450 affects wafer bow, wafer bow of the 3D array device 400 may be measured directly or estimated using data available and previous records. In some embodiments, the quantity, position, dimension, and/or profile of gate line slits 460 may be determined based on the measurement results or estimate results to reduce wafer bow.

For example, the dimensions and shapes of the gate line slits 460 may be the same. In another example, the dimensions and shapes of the gate line slits 460 may be arranged different to reduce wafer bow. In still another example, the maximum slit width of one slit may be different than that of another slit in the Y direction.

The gate line slits 460 may be formed by, e.g., a dry etch process or a combination of dry and wet etch processes. As shown in FIG. 30, the gate line slits 460 may extend through the layer stack 440 and the sacrificial layer 420 and reach or partially penetrate the doped region 411 in the Z direction or along a direction approximately perpendicular to the substrate 410. As such, at the bottom of the gate line slit 460, the doped region 411 is exposed. In some embodiments, the region around the bottom of the gate line slit 460 may be doped with n-type dopants to form an n-well region (not shown).

Thereafter, a selective etch (e.g., a selective wet etch) may be performed to etch away the stack layers 442 and replace the stack layers 442 by conductor layers 444 that includes an electrically conductive material such as W. When the stack layers 442 are replaced, the sacrificial layer 420 is also etched out and replaced by a select gate 422. The conductor layers 444 and the select gate 422 may have the same material. In some embodiments, an oxidation process (e.g., a dry and/or wet oxidation process) may be performed after the selective etch process that removes the stack layers 442 and the sacrificial layer 420. The removal of the sacrificial layer 420 exposes a side portion of the epitaxial layer 457 that may be oxidized to form an insulation region 458 in the oxidation process.

In some embodiments, the select gate 422 may serve as a source select gate. Each conductor layer 444 is configured to electrically connect one or more rows of NAND memory cells along the Y direction or in the X-Y plane and configured as a word line for the 3D array device 400. The channel layer 455 formed in the channel hole 450 is configured to electrically connect a NAND string along the Z direction and configured as a bit line for the 3D array device 400. The 3D array device 400 includes a 2D array of NAND strings. A portion of the conductor layer 444 that is around a portion of the channel hole 450 may function as a control gate or gate electrode for a NAND memory cell.

In some embodiments, after the conductor layers 444 are formed, wafer bow of the 3D array device 400 may be measured directly and filling of the gate line slits 460 may be used to decrease wafer bow. In some other embodiments, wafer bow may be estimated using data available and previous records without direct measurement on wafer bow. The data that may be used for bow estimate may include materials used, processes implemented, and measurement data other than the bow detection data. The previous records may include measurement records and bow reduction solutions obtained in the past.

Then, a deposition process may be performed to deposit a dielectric material 466 (e.g., silicon oxide or silicon nitride) to form an isolation layer on the sidewall and the bottom of the gate line slit 460. The isolation layer on the bottom surface of the gate line slit 460 may be etched away by a selective dry etch process to expose the doped region 411. Then the gate line slit 460 may be filled with electrically conductive materials to form a source contact that electrically contacts the doped region 411. In some embodiments, an electrically conductive material (e.g., titanium nitride) may be deposited first. Next, another electrically conductive material 461 (e.g., polysilicon) may be deposited for the filling process. Then, the gate line slit 460 may be sealed by a plug 462 that may include an electrically conductive material such as W. The deposition may be performed by CVD, PVD, ALD, or a combination of two or more of these processes.

Figure 31A:
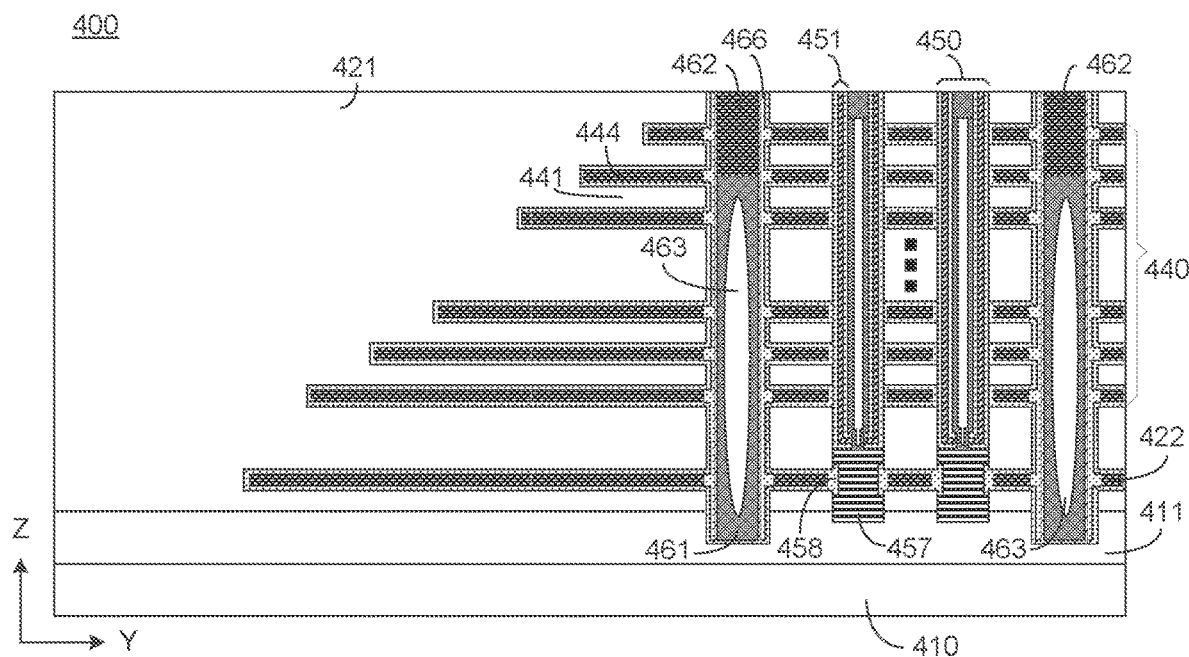
FIGS. 31A, 31B, and 31C illustrate schematically cross-sectional views of the 3D array device shown in FIGS. 29 and 30 after air gaps are formed according to embodiments of the present disclosure.
Figure 31B:
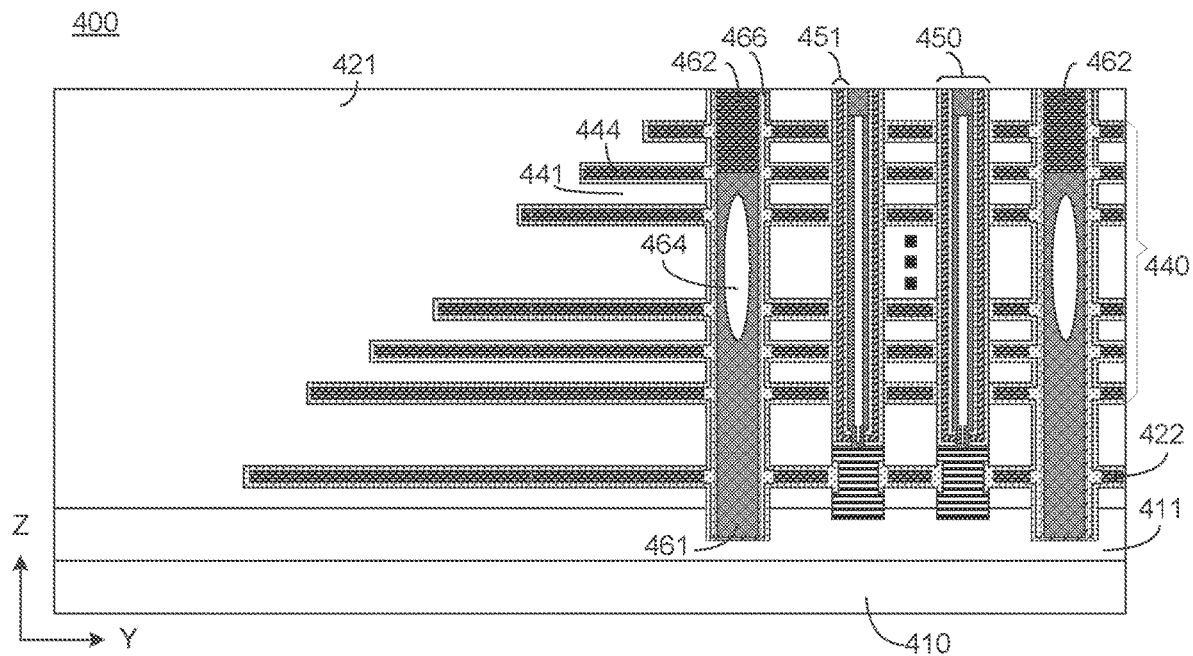
Figure 31C:
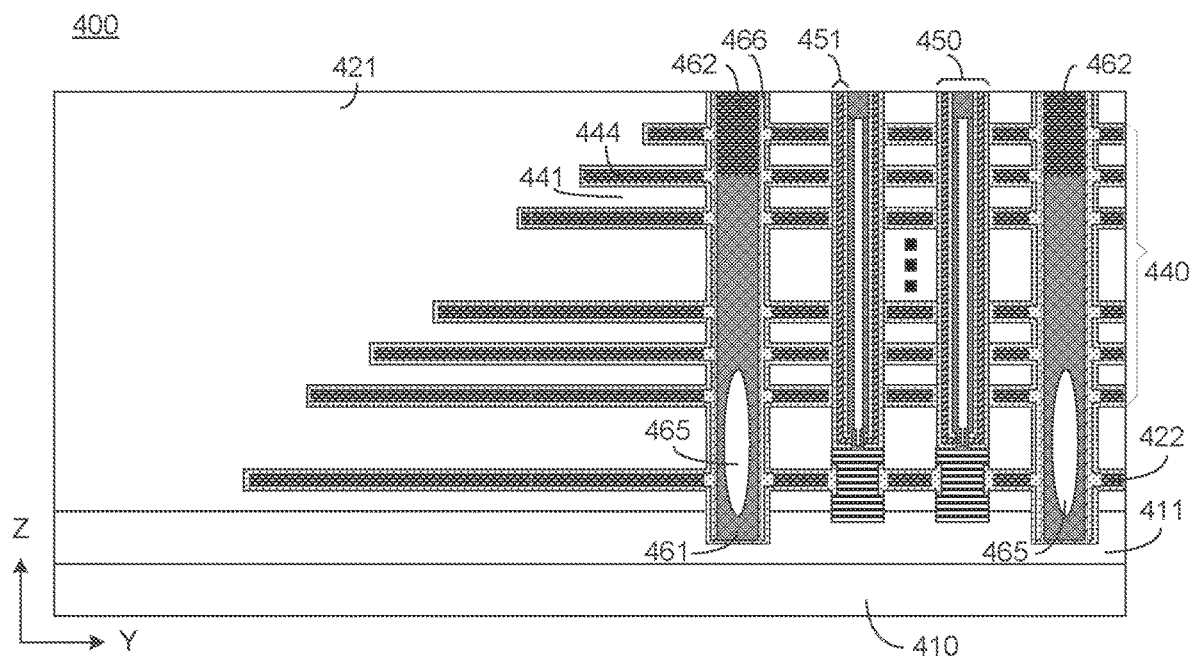

During the filling process, air gaps 463 may be formed, as shown in FIG. 31A. The air gap 463 is surrounded or enclosed by the electrically conductive material 461. The position, dimensions, quantity, and shape of the air gap 463 may be determined based on the measurement results or estimate results to reduce wafer bow. For example, the maximum width of the air gap 463 in the Y direction may be configured equal to or larger than a value that may be calculated using the measurement results or estimate results. Similarly, the extension range of the air gap 463 in the Z direction also may be obtained by calculation. For example, the air gap 463 may extend through the layer stack 440 with the bottom of the air gap 463 close to the bottom of the gate line slit 460 and the top of the air gap 463 close to the top of the gate line slit 460. In another example, the air gaps may be formed to extend through an upper portion of the layer stack 440, such as air gaps 464 shown in FIG. 31B, or the air gaps may be formed to extend through a lower portion of the layer stack 440, such as air gaps 465 shown in FIG. 31C. Hence, the air gaps may be configured at different positions of the gate line slit 460 with different shapes to minimize wafer bow.

In some embodiments, the air gaps of the 3D array device 400 may have the same or similar positions, shapes, and dimensions to reduce wafer bow. In some embodiments, the air gaps of the 3D array device 400 may have different positions, shapes, and/or dimensions to reduce wafer bow. In some embodiments, some gate line slits may have one or more air gaps and some gate line slits may not have an air gap or only have a tiny air gap. The air gaps may be formed using CVD, PVD, ALD, or a combination thereof. For the following fabrication processes of the device 400, the air gap 463 will be used as an example.

After the gate line slits 460 are filled with the electrically conductive material 461 and the plug 462, openings for contacts 471 and word line contacts 472 and 4791 may be formed. The openings for contacts 471, 472, and 4791 are then filled with a conductive material such as W, Co, Cu, Al, or a combination thereof. In some embodiments, a layer of a conductive material (e.g., titanium nitride) may be deposited as a contact layer before another conductive material is deposited when the contacts 471, 472, and 4791 are fabricated. The contacts 471 are electrically connected with the doped region 411. The word line contacts 472 and 4791 are electrically connected with the conductor layers 444 and the select gate 422, respectively.

Next, a dielectric material (e.g., silicon oxide or silicon nitride) may be deposited on the 3D array device 400 that makes the dielectric layer 421 thicker. Vias 473, 474, and 475 may be formed for the contacts 471, 472, and the bit line contacts, respectively. Vias 4792 and 4793 also may be made for the contact 4791 and the source contacts.

Figure 32:
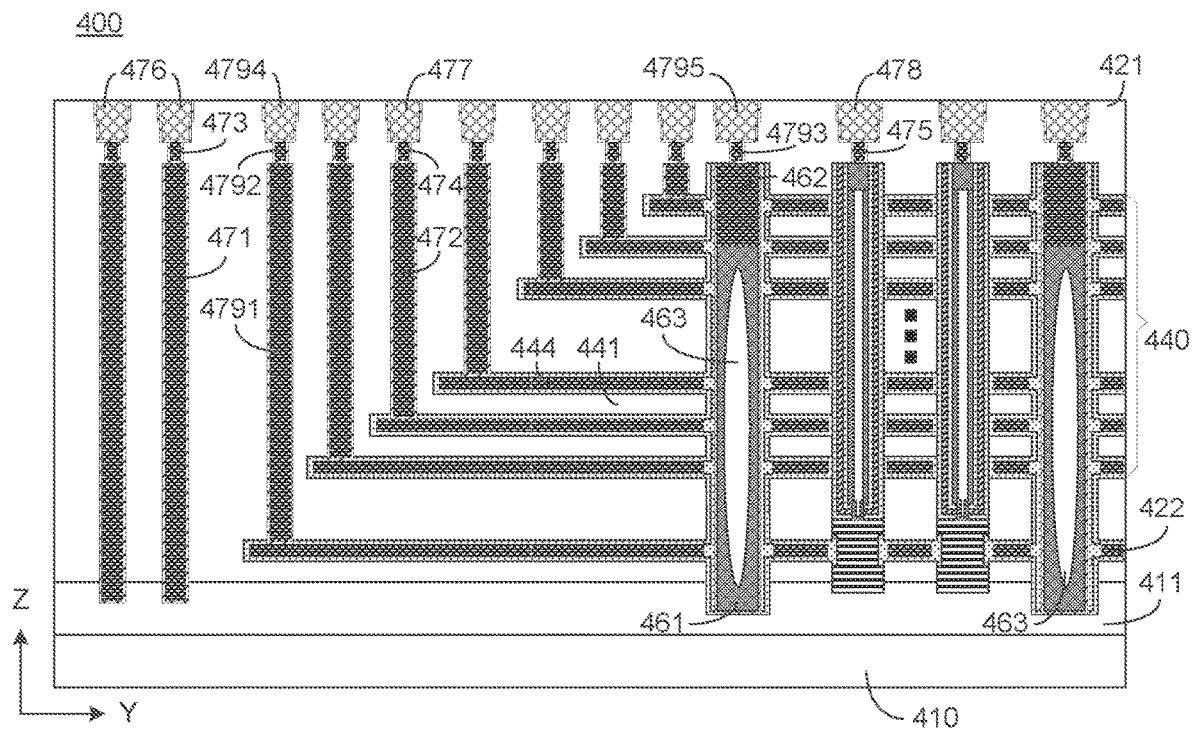
FIG. 32 illustrates schematically a cross-sectional view of the 3D array device shown in FIG. 31A after certain contacts are formed according to embodiments of the present disclosure.

Then a dielectric material (e.g., silicon oxide or silicon nitride) may be deposited to bury the vias 473-475 and 4792-4793 and further make the dielectric layer 421 thicker. Contacts 476, 477, 478, 4794, and 4795 may be formed that serve as interconnects with a peripheral device. As shown in FIG. 32, the contacts 476-478 are electrically connected to vias 473-475, respectively. The contact 4794 and 4795 are electrically connected to the vias 4792 and 4793, respectively. The contacts 476-478 and 4794-4795 and the vias may include an electrically conductive material such as W, Co, Cu, Al, or a combination thereof.

Figure 33:
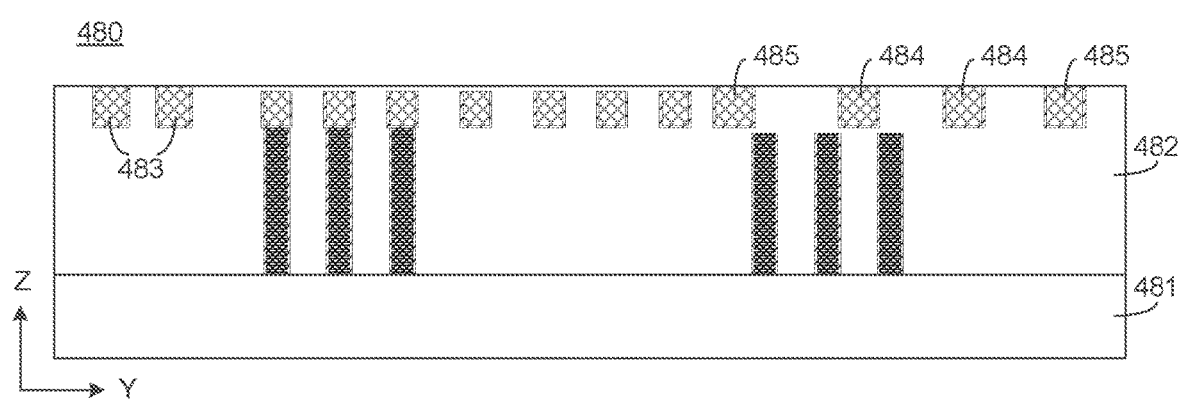
FIG. 33 illustrates schematically a cross-sectional view of anther peripheral device according to embodiments of the present disclosure.

FIG. 33 schematically shows a peripheral device 480 in a cross-sectional view according to embodiments of the present disclosure. The peripheral device 480 may include a semiconductor substrate 481 (e.g., a substrate of single crystalline silicon). Transistors (e.g., MOSFETs) and peripheral circuits (e.g., control circuits) (not shown) may be fabricated on the substrate 481 and used for facilitating the operation of the 3D array device 400. A dielectric layer 482, contacts 483, 484, and 485, and multiple vias may be formed over the substrate 481. The contracts 483-485 are configured for interconnecting with the 3D array device 400 and may include an electrically conductive material (e.g., W, Co, Cu, Al, or a combination thereof).

Figure 34:
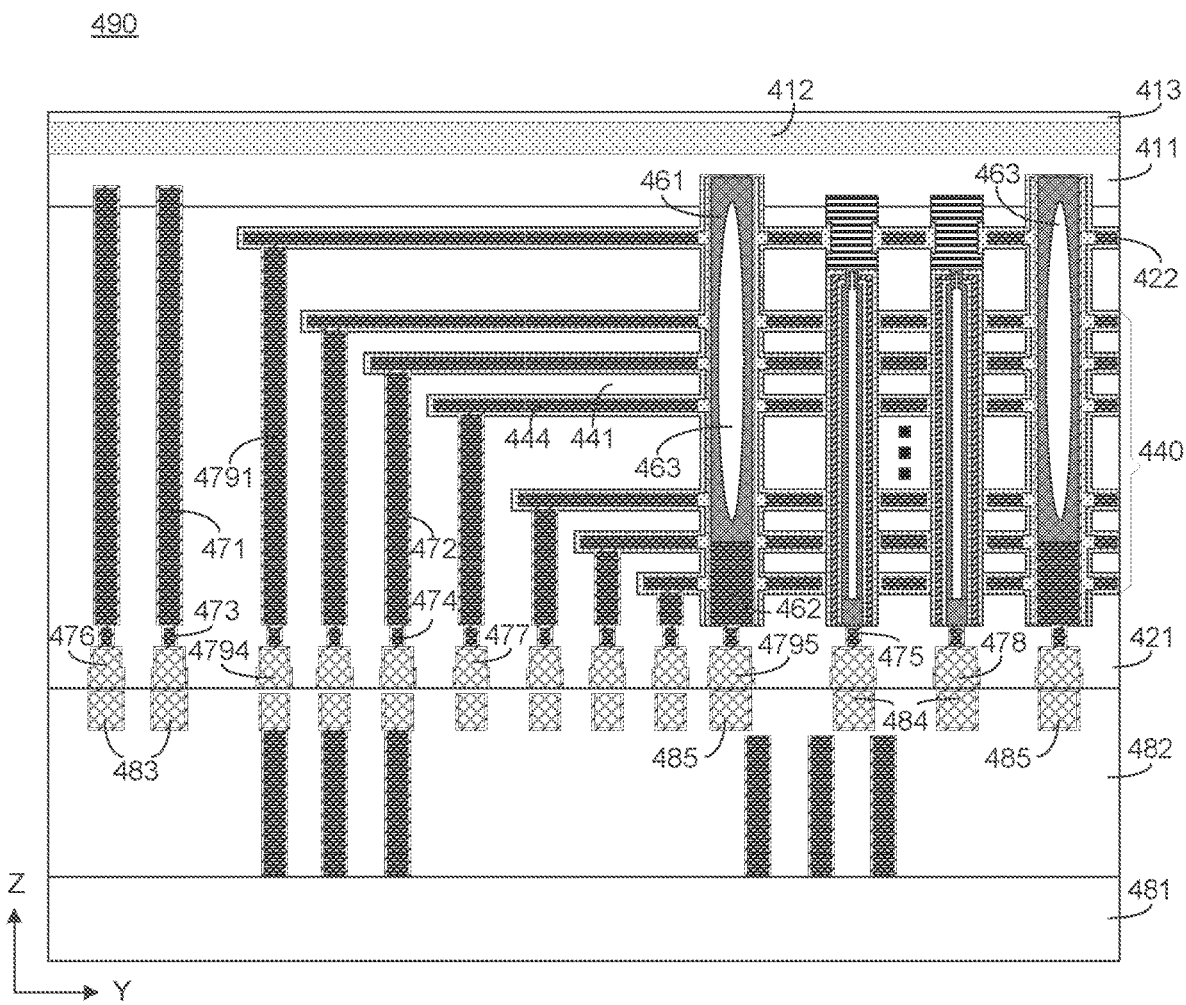
FIG. 34 illustrates schematically a cross-sectional view of another 3D memory device after the 3D array device shown in FIG. 32 is bonded with the peripheral device shown in FIG. 33 according to embodiments of the present disclosure.

FIG. 34 schematically shows an exemplary 3D memory device 490 in a cross-sectional view according to embodiments of the present disclosure. The 3D memory device 490 may include the 3D array device 400 shown in FIG. 32 and the peripheral device 480 shown in FIG. 33. The 3D array device 400 and peripheral device 480 may be bonded by the flip-chip bonding method. In some embodiments, the 3D array device 400 may be flipped upside down and placed above the peripheral device 480. After an alignment step is made, e.g., the contacts 476, 478, and 4795 may be aligned with the contact 483, 484, and 485, respectively, the 3D array device 400 and peripheral 480 may be joined and bonded. In some embodiments, a solder or an electrically conductive adhesive may be used to bond the contacts 476 with the contacts 483, the contacts 478 with the contacts 484, and the contacts 4795 with the contacts 485, respectively. As such, the contacts from the two devices are electrically interconnected, respectively. The 3D array device 400 and peripheral device 480 are in electrical communication after the flip-chip bonding process is implemented.

After the devices 400 and 480 are bonded, the substrate 410 of the 3D array device 400 may be thinned by a thinning process (e.g., wafer grinding, dry etch, wet etch, CMP, or a combination thereof). Then, dielectric layers 412 and 413 may be deposited over the doped region 411. CVD, PVD, ALD, or a combination thereof may be performed. The dielectric layer 413 may serve as a passivation layer. The dielectric layers 412 and 413 may include a dielectric material such as silicon oxide, silicon nitride, silicon oxynitride, TEOS, or a combination thereof, respectively.

By using the disclosed memory structures and methods, wafer bow may be measured directly or estimated during a fabrication process. Air gaps may be configured based on the measurement results or estimate results to reduce wafer bow. Hence, wafer bowing may be minimized during the fabrication process. The 3D memory process may be optimized and the yield may be improved.

Although the principles and implementations of the present disclosure are described by using specific embodiments in the specification, the foregoing descriptions of the embodiments are only intended to help understand the present disclosure. In addition, features of aforementioned different embodiments may be combined to form additional embodiments. A person of ordinary skill in the art may make modifications to the specific implementations and application range according to the idea of the present disclosure. Hence, the content of the specification should not be construed as a limitation to the present disclosure.

What is claimed is:

1. A three-dimensional (3D) memory device, comprising:
   a layer stack;
   a plurality of memory cells disposed through the layer stack;
   a plurality of gate line slit structures disposed through the layer stack to separate the plurality of memory cells into a plurality of blocks;
   a dielectric material disposed on sidewalls of at least one gate line slit structure of the plurality of gate line slit structures; and
   a conductive material in the at least one gate line slit structure, wherein the dielectric material is between the conductive material and the layer stack, wherein:
      an air gap is formed in the at least one gate line slit structure and surrounded by the conductive material, and
      a conductive plug is formed above the conductive material, in the at least one gate line slit structure, and the air gap is separated from the conductive plug by a portion of the conductive material.

2. The 3D memory device according to claim 1, wherein:
   the air gap extends along a vertical direction of the at least one gate line slit structure extending through the layer stack, and
   the air gap has a maximum width equal to or greater than a predetermined value.

3. The 3D memory device according to claim 1, wherein:
   one or more air gaps are formed in one or more gate line slit structures of the plurality of gate line slit structures, and have different shapes, and/or
   the one or more air gaps are formed at different positions among the one or more gate line slit structures.

4. The 3D memory device according to claim 1, further comprising:
   a plug in the at least one gate line slit structure and connecting to the conductive material, wherein the plug is made of a conductive material.

5. The 3D memory device according to claim 1, further comprising:
   a channel layer extending through the layer stack, and
   a functional layer extending through the layer stack and between the channel layer and the layer stack, the functional layer comprising a blocking layer, a charge trap layer, and/or a tunnel insulation layer.

6. The 3D memory device according to claim 1, wherein:
   the layer stack comprises a staircase structure.

7. The 3D memory device according to claim 1, wherein:
   the layer stack comprises a conductor layer and a dielectric layer, alternately stacked.

8. The 3D memory device according to claim 1, further comprising:
   a semiconductor layer on a side portion of a channel layer, wherein the semiconductor layer comprises a single layer or a plurality of epitaxial layers that adjoin each other.

9. A method for fabricating a three-dimensional (3D) memory device, comprising:
   forming a layer stack over a substrate;
   forming a plurality of memory cells through the layer stack over the substrate;
   forming a plurality of gate line slit structures through the layer stack to separate the plurality of memory cells into a plurality of blocks;
   forming a dielectric material on sidewalls of at least one gate line slit structure of the plurality of gate line slit structures;
   forming a conductive material in the at least one gate line slit structure, wherein the dielectric material is between the conductive material and the layer stack, wherein:
      an air gap is formed in the at least one gate line slit structure and surrounded by the conductive material, and
      a conductive plug is formed above the conductive material, in the at least one gate line slit structure, and the air gap is separated from the conductive plug by a portion of the conductive material.

10. The method according to claim 9, wherein:
    the air gap extends along a direction approximately perpendicular to the substrate, and
    the air gap has a maximum width equal to or greater than a predetermined value.

11. The method according to claim 9, wherein:
    one or more air gaps are formed in one or more gate line slit structures of the plurality of gate line slit structures, and have different shapes, and/or
    the one or more air gaps are formed at different positions among the one or more gate line slit structures.

12. The method according to claim 9, further comprising:
    forming a plug in the at least one gate line slit structure to connect to the conductive material, wherein the plug is made of a conductive material.

13. The method according to claim 9, further comprising:
    forming a functional layer, the functional layer extending through the layer stack, and the functional layer comprising a blocking layer, a charge trap layer, and/or a tunnel insulation layer; and
    forming a channel layer extending through the layer stack, the functional layer being between the channel layer and the layer stack.

14. The method according to claim 9, wherein:
    the layer stack comprises a conductor layer and a dielectric layer, alternately stacked.

15. The method according to claim 9, further comprising:
    forming a semiconductor layer over the substrate and on a side portion of a channel layer, wherein the semiconductor layer comprises a single layer or a plurality of epitaxial layers that adjoin each other.

16. A method for fabricating a three-dimensional (3D) memory device, comprising:
    forming a layer stack over a first substrate, the layer stack comprising a plurality of first stack layers and a plurality of second stack layers alternately stacked, wherein the plurality of first stack layers comprise a first dielectric material and the plurality of second stack layers comprise a second dielectric material;

trimming the layer stack to form a staircase structure;

forming a channel layer extending through the layer stack along a direction approximately perpendicular to the first substrate;

forming a gate line slit structure extending through the layer stack along a direction approximately perpendicular to the first substrate;

forming a dielectric material on sidewalls of the gate line slit structure; and forming a conductive material in the gate line slit structure, wherein:

the dielectric material is between the conductive material and the layer stack, and an air gap is formed in the gate line slit structure and surrounded by the conductive material, and a conductive plug is formed above the conductive material, in the at least one gate line slit structure, and the air gap is separated from the conductive plug by a portion of the conductive material.

17. The method according to claim 16, further comprising:

performing a bonding process to fasten a peripheral device, the peripheral device comprising a plurality of transistors formed on a second substrate.

18. The method according to claim 17, further comprising:

determining a maximum width of the air gap, wherein the maximum width of the air gap is equal to or greater than a value that is obtained using measurement results or estimated results.

19. The method according to claim 16, further comprising:

forming a channel hole extending through the layer stack;

forming a functional layer on a side wall of the channel hole, the functional layer comprising a blocking layer, a charge trap layer, and/or a tunnel insulation layer; and filling the channel hole with a dielectric material, wherein the channel layer is adjacent to the functional layer.

20. The method according to claim 16, further comprising:

before forming the layer stack, depositing a sacrificial layer over the first substrate;

removing the sacrificial layer; and depositing a semiconductor layer on the first substrate and a side portion of the channel layer that is close to the first substrate.

\* \* \* \* \*